US011895786B2

(12) United States Patent
Park

(10) Patent No.: US 11,895,786 B2
(45) Date of Patent: Feb. 6, 2024

(54) ELECTRONIC DEVICE AND METHOD FOR MANUFACTURING THE SAME

(71) Applicant: Samsung Electronics Co., Ltd., Suwon-si (KR)

(72) Inventor: Sungeun Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 73 days.

(21) Appl. No.: 17/574,067

(22) Filed: Jan. 12, 2022

(65) Prior Publication Data

US 2022/0225517 A1 Jul. 14, 2022

Related U.S. Application Data

(63) Continuation of application No. PCT/KR2022/000324, filed on Jan. 7, 2022.

(30) Foreign Application Priority Data

Jan. 13, 2021 (KR) .................. 10-2021-0004528

(51) Int. Cl.
H05K 5/02 (2006.01)
H05K 5/03 (2006.01)
H05K 5/06 (2006.01)

(52) U.S. Cl.
CPC ............ H05K 5/0213 (2013.01); H05K 5/03 (2013.01); H05K 5/068 (2013.01)

(58) Field of Classification Search
CPC ...................................................... H05K 7/00
See application file for complete search history.

(56) References Cited

U.S. PATENT DOCUMENTS

| 8,351,300 | B2 | 1/2013 | Sano |
| 10,528,006 | B2* | 1/2020 | Park .................. A44C 5/14 |
| 2002/0064100 | A1 | 5/2002 | Della Santa |
| 2008/0298928 | A1 | 12/2008 | Ling et al. |
| 2017/0048994 | A1 | 2/2017 | Lee |
| 2019/0187619 | A1* | 6/2019 | Wahler ............ G04B 37/0041 |

FOREIGN PATENT DOCUMENTS

| JP | 2001-153970 A | 6/2001 |
| JP | 2002-214366 A | 7/2002 |
| JP | 4692608 B2 | 3/2011 |
| JP | 2020-56707 A | 4/2020 |

(Continued)

OTHER PUBLICATIONS

International Search Report of the International Searching Authority dated Apr. 26, 2022, in connection with International Application No. PCT/KR2022/000324, 8 pages.

*Primary Examiner* — Jerry Wu

(57) ABSTRACT

Disclosed herein is an electronic device. The electronic device includes a housing provided to accommodate a printed circuit board, a cover coupled to the housing, and including a coupling protrusion protruding to a side of the housing to be accommodated in the housing, and including a coupling hole formed in the coupling protrusion, a fastening pin arranged in the coupling hole and configured to couple to the housing, and a sealing member arranged between an inner wall forming the coupling hole and the fastening pin to seal the coupling hole. Various other embodiments are possible.

15 Claims, 32 Drawing Sheets

(56) References Cited

FOREIGN PATENT DOCUMENTS

| KR | 10-2016-0143122 A | 12/2016 |
| KR | 10-2017-0020149 A | 2/2017 |
| KR | 10-2017-0040016 A | 4/2017 |
| KR | 10-2019-0036972 A | 4/2019 |
| KR | 10-2019-0074985 A | 6/2019 |

\* cited by examiner

ELECTRONIC DEVICE AND METHOD FOR MANUFACTURING THE SAME

CROSS-REFERENCE TO RELATED APPLICATIONS

This application is a continuation of International Application No. PCT/KR2022/000324, filed Jan. 7, 2022, which is based on and claims priority under 35 U.S.C. § 119 to Korean Patent Application No. 10-2021-0004528, filed Jan. 13, 2021, in the Korean Intellectual Property Office, the disclosures of which are incorporated by reference herein in their entirety.

BACKGROUND

1. Field

The disclosure relates to an electronic device and a method for manufacturing the same, and more particularly, to an electronic device with improved productivity and a method for manufacturing the same.

2. Description of Related Art

An electronic device may include at least one of home appliances, an electronic notebook, a portable multimedia player, a mobile communication terminal, a tablet PC, a video/audio device, a desktop/laptop computer, and a vehicle navigation system.

Recently, waterproof performance is required for electronic devices. For such waterproof performance, an auxiliary material such as a gasket or tape may be used between a housing and a cover to seal a space between the housing and the cover. In this case, a fastening method through a screw may be performed to prevent the housing and the cover from being separated from each other.

SUMMARY

A fastening method using screws may damage an exterior design of an electronic device, and may lower the productivity of the electronic device. Accordingly, there is a demand to increase productivity and at the same time, to seal between a housing and a cover upon assembling the electronic device.

Therefore, aspects of the disclosure are to provide an electronic device with improved assembly and productivity of a housing and a cover.

Other aspects of the disclosure provide an electronic device including an improved exterior design.

Additional aspects of the disclosure will be set forth in part in the description which follows and, in part, will be obvious from the description, or may be learned by practice of the disclosure.

In accordance with an aspect of the disclosure, an electronic device includes a housing configured to accommodate a printed circuit board, a cover coupled to the housing, and including a coupling protrusion protruding to an inner side of the housing to be accommodated in the housing and a coupling hole formed in the coupling protrusion, a fastening member disposed in the coupling hole and configured to couple the cover to the housing, and a sealing member disposed between an inner wall forming the coupling hole and the fastening member to seal the coupling hole.

Before undertaking the detailed description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

FIGS. 1 through 32, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
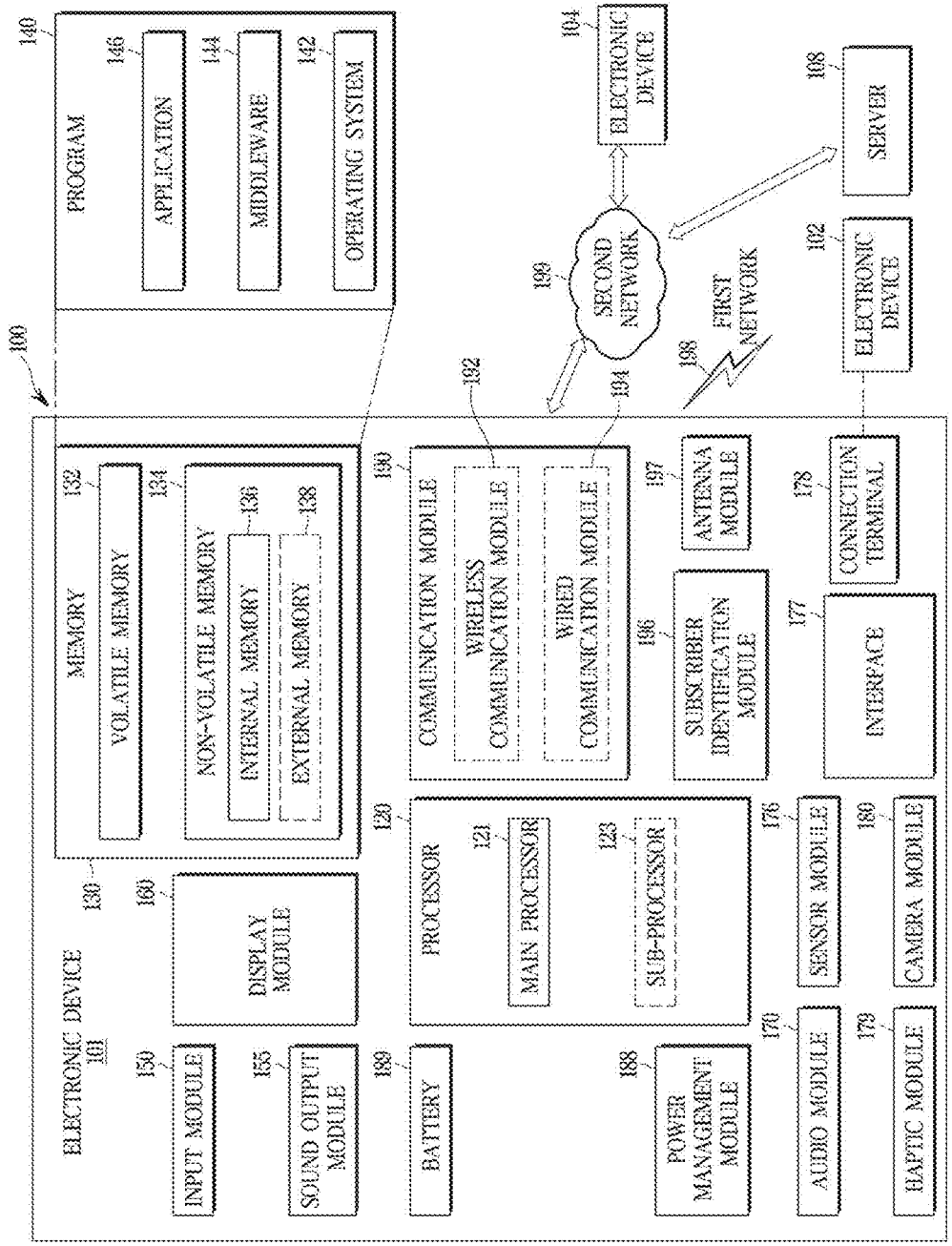
FIG. 1 is a block diagram of an electronic device in a network environment according to various embodiments of the disclosure.

FIG. 1 is a diagram of an electronic device 101 in a network environment 100 according to various embodiments of the disclosure. Referring to FIG. 1, in the network environment 100, the electronic device 101 may communicate with an electronic device 102 through a first network 198 (e.g., a short-range wireless communication network) or may communicate with at least one of an electronic device 104 and a server 108 through a second network 199 (e.g., a long-distance wireless communication network). According to an embodiment, the electronic device 101 may communicate with the electronic device 104 through the server 108. According to an embodiment, the electronic device 101 may include a processor 120, a memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module 196, or an antenna module 197. In some embodiments, at least one of these components (e.g., the connection terminal 178) may be omitted or one or more other components may be added to the electronic device 101. In some embodiments, some of these components (e.g., the sensor module 176, the camera module 180, or the antenna module 197) may be integrated into one component (e.g., the display module 160).

The processor 120 may execute software (e.g., a program 140) to control at least one other component (e.g., a hardware or software component) of the electronic device 101 connected to the processor 120, and perform various data processing or operations. According to an embodiment, as at least a part of data processing or operation, the processor 120 may store instructions or data received from other components (e.g., the sensor module 176 or the communication module 190) in a volatile memory 132, process the instructions or data stored in the volatile memory 132, and store the result data in a non-volatile memory 134. According to an embodiment, the processor 120 may include a main processor 121 (e.g., a central processing unit or an application processor) or a sub-processor 123 (e.g., a graphics processing unit, a neural network processing unit (NPU), an image signal processor, a sensor hub processor, or a communication processor) that is operated independently of the main processor or operated together with the main processor. For example, when the electronic device 101 includes the main processor 121 and the sub-processor 123, the sub-processor 123 may use less power than the main processor 121 or set to be specialized for a specified function. The sub-processor 123 may be implemented separately from the main processor 121 or implemented as a part of the main processor 121.

On behalf of the main processor 121 during the main processor 121 is in an inactive (e.g., sleep) state, or together with the main processor 121 during the main processor 121 is in an active (e.g., execution of an application) state, the sub-processor 123 may control at least one of functions or states related to at least one component (e.g., the display module 160, the sensor module 176, or the communication module 190) among components of the electronic device 101. According to an embodiment, the sub-processor 123 (e.g., an image signal processor or a communication processor) may be implemented as a part of another functionally related component (e.g., the camera module 180 or the communication module 190). According to an embodiment, the sub-processor 123 (e.g., the neural network processing unit) may include a hardware structure specialized for processing an artificial intelligence model. The artificial intelligence models may be generated through machine learning. The learning may be performed in the electronic device 101 itself in which the artificial intelligence model is performed, or may be performed through a separate server (e.g., the server 108). A learning algorithm may include supervised learning, unsupervised learning, semi-supervised learning, or reinforcement learning, but is not limited to thereto. The artificial intelligence model may include a plurality of artificial neural network layers. Artificial neural networks may be deep neural networks (DNNs), convolutional neural networks (CNNs), recurrent neural networks (RNNs), restricted boltzmann machines (RBMs), deep belief networks (DBNs), bidirectional recurrent deep neural networks (BRDNNs), deep Q-networks or a combination of two or more of these networks, but is not limited to thereto. The artificial intelligence model may additionally or alternatively include a software structure in addition to the hardware structure.

The memory 130 may store various data used by at least one component (e.g., the processor 120 or the sensor module 176) of the electronic device 101. The data may include software (e.g., the program 140) and input data or output data for instructions related to the software. The memory 130 may include the volatile memory 132 or the non-volatile memory 134.

The program 140 may be stored as software in the memory 130, and may include an operating system 142, a middleware 144, or an application 146.

The input module 150 may receive instructions or data to be used by a component (e.g., the processor 120) of the electronic device 101 from the outside (e.g., a user) of the electronic device 101. The input module 150 may include a microphone, a mouse, a keyboard, a key (e.g., a button), or a digital pen (e.g., a stylus pen).

The sound output module 155 may output a sound signal to the outside of the electronic device 101. The sound output module 155 may include a speaker or a receiver. The speaker may be used for general purposes such as multimedia playback or recording playback. The receiver may be used to receive incoming calls. According to an embodiment, the receiver may be implemented separately from the speaker or as a part of the speaker.

The display module 160 may visually provide information to the outside (e.g., a user) of the electronic device 101. The display module 160 may include a display, a hologram device, or a projector and a control circuit for controlling the corresponding device. According to an embodiment, the display module 160 may include a touch sensor configured to sense a touch or a pressure sensor configured to measure an intensity of a force generated by the touch.

The audio module 170 may convert a sound into an electric signal or, conversely, convert an electric signal into a sound. According to an embodiment, the audio module 170 may obtain a sound through the input module 150 or output a sound through an external electronic device (the electronic device 102: e.g., a speaker or a headphone) directly or wirelessly connected to the electronic device 101.

The sensor module 176 may detect an operating state (e.g., power or temperature) of the electronic device 101 or an external environmental state (e.g., user state), and generate an electrical signal or data value corresponding to the detected state. According to an embodiment, the sensor module 176 may include a gesture sensor, a gyro sensor, an air pressure sensor, a magnetic sensor, an acceleration sensor, a grip sensor, a proximity sensor, a color sensor, an infrared (IR) sensor, a biosensor, a temperature sensor, a humidity sensor, or an illuminance sensor.

The interface 177 may support one or more specified protocols that may be used for the electronic device 101 to be directly or wirelessly connected to an external electronic device (e.g., the electronic device 102). According to an embodiment, the interface 177 may include a high-definition multimedia interface (HDMI), a universal serial bus (USB) interface, an SD card interface, or an audio interface.

The connection terminal 178 may include a connector through which the electronic device 101 may be physically connected to an external electronic device (e.g., the electronic device 102). According to an embodiment, the connection terminal 178 may include an HDMI connector, a USB connector, a SD card connector, or an audio connector (e.g., a headphone connector).

The haptic module 179 may convert an electrical signal into a mechanical stimulus (e.g., vibration or movement) or an electrical stimulus that the user can perceive through tactile or kinesthetic sense. According to an embodiment, the haptic module 179 may include a motor, a piezoelectric element, or an electrical stimulation device.

The camera module 180 may image still images and moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least a part of a power management integrated circuit (PMIC).

The battery 189 may supply power to at least one component of the electronic device 101. According to an embodiment, the battery 189 may include a non-rechargeable primary cell, a rechargeable secondary cell, or a fuel cell.

The communication module 190 may establish a direct (e.g., wired) communication channel or a wireless communication channel between the electronic device 101 and an external electronic device (e.g., the electronic device 102, the electronic device 104, or the server 108) and support communication performance through the established communication channel. The communication module 190 may include one or more communication processors configured to be operated independently of the processor 120 (e.g., an application processor), and configured to support direct (e.g., wired) communication or wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication module). A corresponding communication module among these communication modules may communicate with the external electronic device 104 through a first network 198 (e.g., a short-range communication network such as Bluetooth, wireless fidelity (Wi-Fi) direct, or infrared data association (IrDA)) or a second network 199 (e.g., a long-distance communication network such as a legacy cellular network, a 5G network, a next-generation communication network, the Internet, or a computer network (e.g., LAN or WAN)). These various types of communication modules may be integrated into one component (e.g., a single chip) or may be implemented as a plurality of components (e.g., multiple chips) separated from each other. The wireless communication module 192 may identify or authenticate the electronic device 101 within a communication network, such as the first network 198 or the second network 199, by using subscriber information (e.g., International Mobile Subscriber Identifier (IMSI)) stored in the subscriber identification module 196.

The wireless communication module 192 may support a 5G network after a 4G network and a next-generation communication technology, for example, a new radio (NR) access technology. NR access technology may support enhanced mobile broadband (eMBB) that is high-speed transmission of high-capacity data, massive machine type communications (mMTC) that is minimization of terminal power and access to multiple terminals, or ultra-reliable and low-latency communications (URLLC). The wireless communication module 192 may support a high frequency band (e.g., mmWave band) to achieve a high data transmission rate. The wireless communication module 192 may support various techniques, such as beamforming, massive multiple-input and multiple-output (MIMO), full dimensional MIMO (FD-MIMO), an array antenna, analog beam-forming, or a large-scale antenna, for securing performance in a high-frequency band. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for realization of eMBB, loss coverage for realization of mMTC (e.g., 164 dB or less), or U-plane latency (e.g., downlink (DL) and uplink (UL) of each 0.5 ms or less, or round trip of 1 ms or less) for realization of URLLC.

The antenna module 197 may transmit or receive a signal or power to or from the outside (e.g., an external electronic device). According to an embodiment, the antenna module 197 may include an antenna including a radiator composed of a conductor or a conductive pattern formed on a substrate (e.g., a PCB). According to an embodiment, the antenna module 197 may include a plurality of antennas (e.g., an array antenna). In this case, at least one antenna suitable for a communication method used in a communication network such as the first network 198 or the second network 199 may be selected from among the plurality of antennas by the communication module 190. A signal or power may be transmitted or received between the communication module 190 and an external electronic device through the selected at least one antenna. According to some embodiments, other components (e.g., a radio frequency integrated circuit (RFIC)) other than the radiator may be additionally formed as a part of the antenna module 197.

According to various embodiments, the antenna module 197 may form a mmWave antenna module. According to an embodiment, the mmWave antenna module may include a printed circuit board, an RFIC arranged on or adjacent to a first surface (e.g., lower surface) of the printed circuit board and configured to support a designated high frequency band (e.g., mmWave band), and a plurality of antennas (e.g., an array antenna) arranged on or adjacent to a second surface (e.g., upper surface or lateral surface) of the printed circuit board and configured to transmit or receive signals of the designated high frequency band.

At least some of the components may be connected to each other and exchange a signal (e.g., instructions or data) with each other through a communication method between peripheral devices (e.g., a bus, general purpose input and output (GPIO), serial peripheral interface (SPI), or mobile industry processor interface (MIPI)).

According to an embodiment, the instruction or data may be transmitted or received between the electronic device 101 and the external electronic device 104 through the server 108 connected to the second network 199. Each of the external electronic devices 102 or 104 may be the same or a different type of the electronic device 101. According to an embodiment, all or a part of the operations executed in the electronic device 101 may be executed in one or more of the external electronic devices 102, 104, or 108. For example, when the electronic device 101 needs to perform a function or service automatically or in response to a request from a user or other device, the electronic device 101 may perform the function or service by itself or additionally, may request one or more external electronic devices to perform at least a part of the function or the service. The one or more external electronic devices receiving the request may execute at least a part of the requested function or service, or an additional function or service related to the request, and transmit a result of the execution to the electronic device 101. The electronic device 101 may provide the result, without the change, as at least a part of a response to the request, or additionally process the result and provide the processed result as at least a part of a response to the request. For this purpose, a technology such as cloud computing, distributed computing, mobile edge computing (MEC), or client-server computing may be used. The electronic device 101 may provide an ultra-low latency service using distributed computing or mobile edge computing. In another embodiment, the external electronic device 104 may include an Internet of things (IoT) device. The server 108 may be an intelligent server using machine learning and/or neural networks. According to an embodiment, the external electronic device 104 or the server 108 may be included in the second network 199. The electronic device 101 may be applied to an intelligent service (e.g., smart home, smart city, smart car, or health care) based on 5G communication technology and IoT-related technology.

The electronic device according to various embodiments disclosed in the disclosure may have various types of devices. For example, the electronic device may include a portable communication device (e.g., a smart phone), a computer device, a portable multimedia device, a portable medical device, a camera, a wearable device, or a home appliance device. The electronic device according to the embodiment of the disclosure is not limited to the above-described devices.

The various embodiments and the terms used therein are not intended to limit the technology disclosed herein to specific forms, and the disclosure should be understood to include various modifications, equivalents, and/or alternatives to the corresponding embodiments. In describing the drawings, similar reference numerals may be used to designate similar constituent elements. A singular expression may include a plural expression unless they are definitely different in a context. The expressions "A or B," "at least one of A or/and B," or "one or more of A or/and B," and the like used herein may include any and all combinations of one or more of the associated listed items. Herein, the expressions "a first", "a second", "the first", "the second", etc., may simply be used to distinguish an element from other elements, but is not limited to another aspect (importance or order) of elements. When an element (e.g., a first element) is referred to as being "(functionally or communicatively) coupled," or "connected" to another element (e.g., a second element), the first element may be connected to the second element, directly (e.g., wired), wirelessly, or through a third component.

As used herein, the term "module" may refer to a unit that includes one or a combination of two or more of hardware, software, or firmware. A "module" may be interchangeably used with terms such as, for example, unit, logic, logical block, component, or circuit. The module may be a minimum unit or part of an integrally constructed part. The module may be a minimum unit or part of performing one or more functions. The "module" can be implemented mechanically or electronically. For example, a "module" may be implemented in the form of an application-specific integrated circuit (ASIC).

Various embodiments of the present document may be implemented as software (e.g., the program 140) including one or more instructions stored in a storage medium (e.g., an internal memory 136 or an external memory 138) readable by a machine (e.g., the electronic device 101). For example, a processor (e.g., the processor 120) of a device (e.g., the electronic device 101) may call at least one instruction among one or more instructions stored in a storage medium and execute the instruction. This makes it possible for the device to be operated to perform at least one function according to the called at least one instruction. The one or more instructions may include code generated by a compiler or code executable by an interpreter. Storage medium readable by machine, may be provided in the form of a non-transitory storage medium. "Non-transitory" means that the storage medium is a tangible device and does not contain a signal (e.g., electromagnetic wave), and this term includes a case in which data is semi-permanently stored in a storage medium and a case in which data is temporarily stored in a storage medium.

The method according to the various disclosed embodiments may be provided by being included in a computer program product. Computer program products may be traded between sellers and buyers as commodities. Computer program products are distributed in the form of a device-readable storage medium (e.g., compact disc read only memory (CD-ROM)), or are distributed directly or online (e.g., downloaded or uploaded) between two user devices (e.g., smartphones) through an application store (e.g., Play Store™). In the case of online distribution, at least a portion of the computer program product (e.g., downloadable app) may be temporarily stored or created temporarily in a device-readable storage medium such as the manufacturer's server, the application store's server, or the relay server's memory.

According to various embodiments, each component (e.g., a module or a program) of the above-described components may include a singular or a plurality of entities, and some of the plurality of entities may be separately arranged in other components. According to various embodiments, one or more components or operations among the above-described corresponding components may be omitted, or one or more other components or operations may be added. Alternatively or additionally, a plurality of components (e.g., a module or a program) may be integrated into one component. In this case, the integrated component may perform one or more functions of each component of the plurality of components identically or similarly to those performed by the corresponding component among the plurality of components prior to the integration. Operations performed by a module, a program module, or other elements according to various embodiments of the present disclosure may be executed sequentially, in parallel, repeatedly, or in a heuristic method. Also, a portion of operations may be executed in different sequences, omitted, or other operations may be added.

According to various embodiments of the disclosure, the electronic device may include at least one of a mobile communication terminal, a tablet PC, and a wearable electronic device. However, the following description will be made based on the wearable electronic device.

Figure 2:
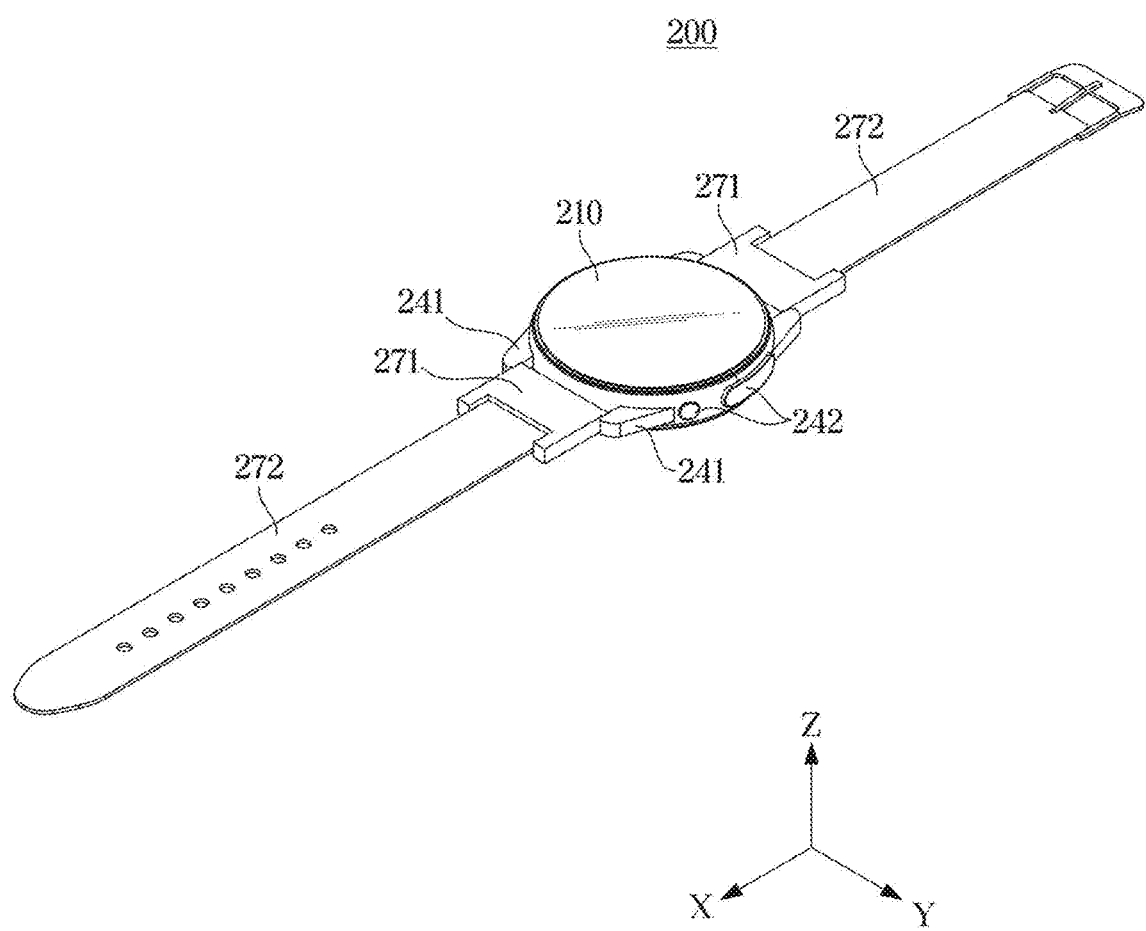
FIG. 2 is a perspective view illustrating an electronic device according to one of the various embodiments of the disclosure.
Figure 3:
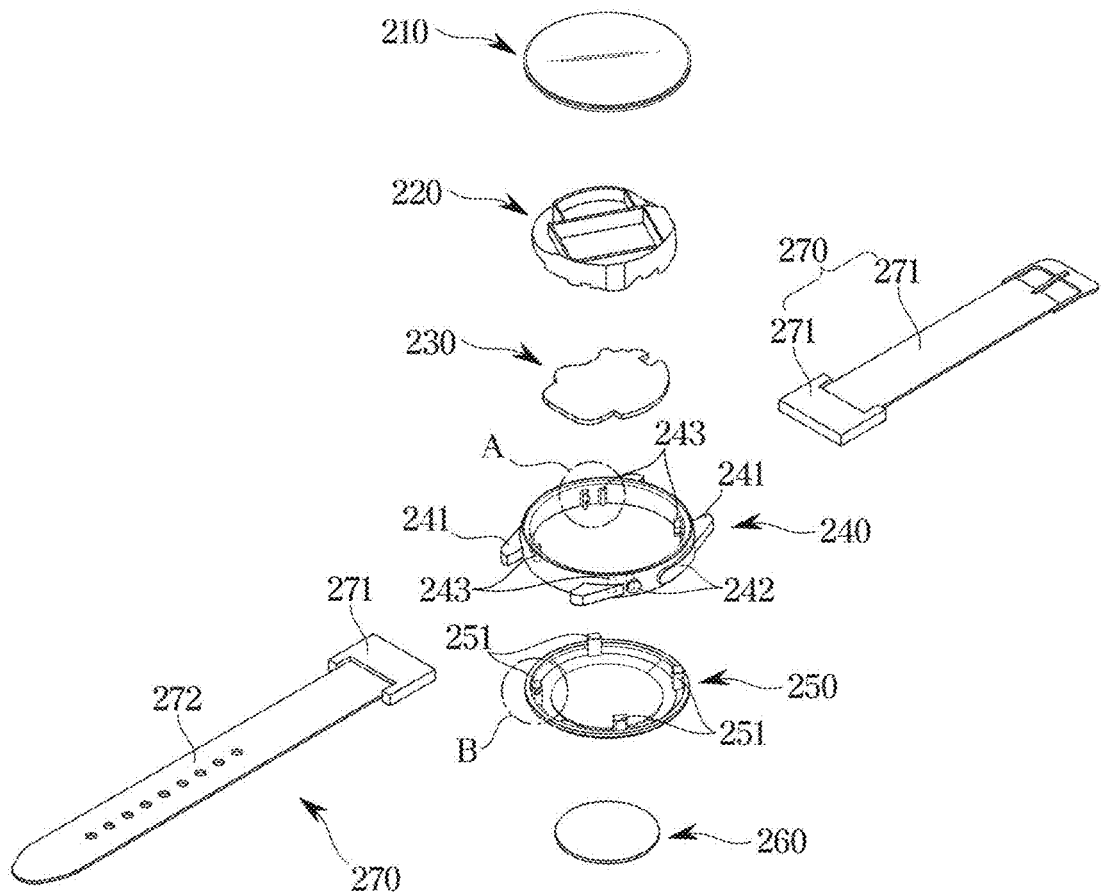
FIG. 3 is an exploded-perspective view illustrating the electronic device according to one of the various embodiments of the disclosure.

FIG. 2 is a perspective view illustrating the electronic device according to one of the various embodiments of the disclosure. FIG. 3 is an exploded-perspective view illustrating the electronic device according to one of the various embodiments of the disclosure.

Referring to FIGS. 2 and 3, an electronic device 200 (e.g., the electronic device 101 of FIG. 1) according to an embodiment of the disclosure may include a display 210, a support structure 220, a printed circuit board 230, a housing 240, a cover 250, a back glass 260, and bands 270.

According to an embodiment of the disclosure, the display 210 (e.g., the display module 160 of FIG. 1) may be at least one of a liquid crystal display (LCD), a light emitting diode (LED) display, an organic light emitting diode (OLED) display, or a microelectromechanical system (MEMS) display. According to an embodiment, the display 210 may be provided with a touch panel to perform a touch screen function. According to an embodiment, an antenna radiator is arranged inside the display 210 to perform a wireless communication function. According to an embodiment, the display 210 may be electrically connected to a display circuit board (not shown). The display circuit board may be arranged inside the housing 240. The display circuit board may be connected to the printed circuit board 230 to transmit an electrical signal for driving the display 210.

According to an embodiment of the disclosure, the support structure 220 may be arranged in an inner space of the housing 240, and may provide a space in which electronic components are arranged while reinforcing a rigidity of the housing 240. The support structure 220 may include a waterproof structure provided to seal a space between the support structure 220 and the housing 240. The support structure 220 may include a seating surface on which the waterproof structure is mounted.

According to an embodiment of the disclosure, the printed circuit board 230 may be arranged in the inner space of the housing 240. According to an embodiment, the printed circuit board 230 may be arranged on a lower surface of the support structure 220. Electronic components such as a processor (e.g., the processor 120 of FIG. 1), a communication module (e.g., the communication module 190 of FIG. 1), or a sound output device (e.g., the sound output module 155 of FIG. 1) may be arranged on the printed circuit board 230. According to an embodiment of the disclosure, a battery (not shown) may be arranged inside the housing 240, and the printed circuit board 230 may be electrically connected to the battery. The printed circuit board 230 may be electrically connected to the antenna radiator through a connector.

According to an embodiment of the disclosure, the antenna radiator or a wireless charging antenna may be included in the housing 240. The antenna radiator may transmit and receive a radio signal using a magnetic secure transmission (MST) method. For example, the antenna radiator may be an MST antenna. As another example, the antenna radiator may be a near field communication (NFC) antenna configured to transmit and receive a wireless signal in the NFC method. A shielding structure may be arranged around the antenna radiator to block signal interference between other electronic components such as a sensor module. According to an embodiment, the wireless charging antenna may be attached to one surface of the printed circuit board 230. The wireless charging antenna may be formed in a flat coil shape. The wireless charging antenna may be formed of a conductive material and may be electrically connected to the printed circuit board 230. The wireless charging antenna may generate a current by electromagnetic induction generated from an external electronic device. The current generated by the wireless charging antenna may charge the battery (not shown) through the printed circuit board 230.

According to an embodiment of the disclosure, the housing 240 may include a band coupling portion 241. The band coupling portion may protrude from an outer wall of the housing 240. The band coupling portion 241 may be formed as a pair to be coupled to the bands 270. However, the number and shape of the band coupling portion 241 is not limited to those in the drawings, and may be formed in various numbers and shapes as long as the band coupling portion is coupled to the bands 270.

According to an embodiment of the disclosure, a plurality of buttons 242 may be arranged on the outer wall of the housing 240. For example, the plurality of buttons 242 may include a power key configured to turn the power on and off for the electronic device 200 or a menu key configured to select various menus of the electronic device. However, the plurality of buttons 242 are not limited to the power key or the menu key, and may be various buttons configured to manipulate the electronic device, such as a volume control key.

According to an embodiment of the disclosure, the housing 240 may include a fixing rib 243 protruding from an inner wall 240a of the housing. The fixing rib 243 may be provided in plural. For example, the fixing ribs 243 may be provided in four pairs. However, the disclosure is not limited thereto, and the fixing ribs 243 may be provided in various amounts.

According to an embodiment of the disclosure, the cover 250 may be coupled to the lower surface of the housing 240. The cover 250 may cover a lower portion of the housing 240. Accordingly, the support structure 220 and the printed circuit board 230 may be accommodated in the housing 240 and the cover 250.

According to an embodiment of the disclosure, the cover 250 may include a coupling protrusion 251 protruding in a Z direction. The coupling protrusion 251 may be provided in plural in accordance with the number of fixing ribs 243. For example, four coupling protrusions 251 may be provided. However, the disclosure is not limited thereto, and the coupling protrusions 251 may be provided in various amounts.

According to an embodiment of the disclosure, the back glass 260 may be coupled to a lower surface of the cover 250. The back glass 260 may be in contact with a part of the body (e.g., a wrist). The back glass 260 may be formed of a transparent glass material. For example, the transparent back glass 260 may transmit light irradiated from the sensor module (e.g., the sensor module 176 of FIG. 1) arranged inside the housing 240 to allow the sensor module to sense an electrical signal for body information. According to an embodiment, the back glass 260 is not limited to a glass material, and may be formed of various materials such as resin or metal.

According to an embodiment of the disclosure, the bands 270 may be removably coupled to the housing 240. The bands 270 may have a shape that is worn on a part of the body. The bands 270 may include a first portion 271 and a second portion 272. A battery (not shown) may be arranged in the first portion 271. Further, a camera module (e.g., the camera module 180 of FIG. 1) may be arranged in the first portion 271. However, the electronic component arranged on the first portion 271 of the bands 270 is not limited to the battery or the camera module, and various electronic components such as a sensor module may be arranged on the first portion 271 of the bands 270. According to an embodiment of the disclosure, the second portion 272 of the bands 270 may extend in a direction away from the housing 240. The bands 270 may be formed of various materials such as rubber, plastic, metal, or leather.

Figure 4:
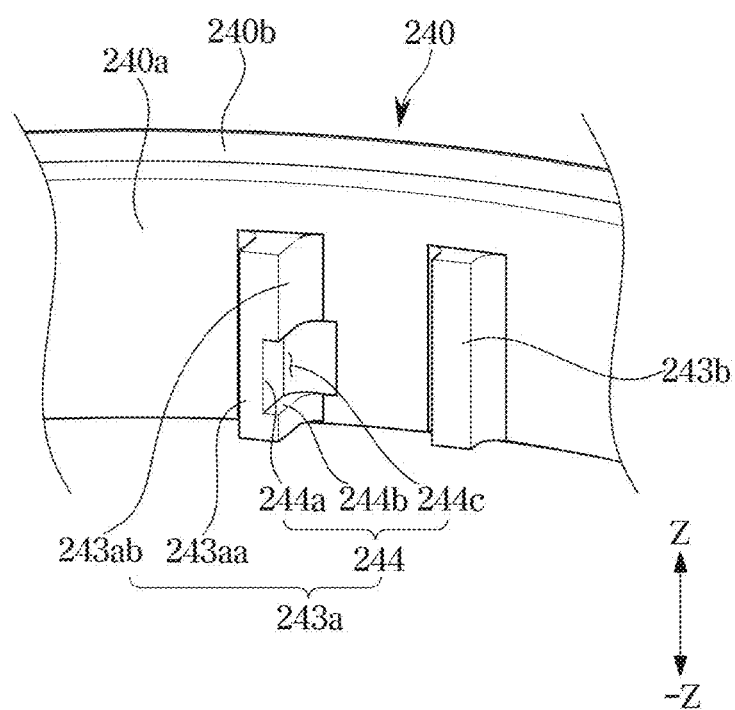
FIG. 4 is a perspective view of the electronic device according to the various embodiments of the disclosure.

FIG. 4 is a perspective view of the electronic device according to various embodiments of the disclosure.

For example, FIG. 4 is a perspective view illustrating a portion A of the electronic device illustrated in FIG. 3.

Referring to FIG. 4, according to an embodiment of the disclosure, the housing 240 may include an inner wall 240a, a display mounting portion 240b, and the fixing rib 243. The display mounting portion 240b may be provided in an upper side of the inner wall 240a. The display mounting portion 240b may allow the display 210 to be coupled to one side of the housing 240. For example, the display mounting portion 240b may be provided to allow the display 210 to be coupled from the upper side of the housing 240. For example, the display mounting portion 240b may be provided at one end of the housing 240 in the Z direction.

According to an embodiment of the disclosure, the fixing rib 243 may protrude from the inner wall 240*a* of the housing 240 to allow the housing 240 to be coupled to a fastening member 280 to be described later. The fixing rib 243 may protrude toward the center of the housing 240. The fixing rib 243 may be provided in plural. The coupling protrusion 251 and the fastening member 280 to be described later may be arranged between the plurality of fixing ribs 243.

According to an embodiment of the disclosure, the plurality of fixing ribs 243 may include a first fixing rib 243*a* and a second fixing rib 243*b*. The first fixing rib 243 may include a first side 243*aa* and a second side 243*ab*. The first side 243*aa* may protrude from the inner wall 240*a* of the housing 240 to face the center of the housing 240. The second side 243*ab* may be formed on a side surface of the first side 243*aa* to face a moving direction of the fastening member 280 to be described later. The fastening member 280 may be a fastening pin 280. Hereinafter the fastening member 280 will be referred to as a fastening pin 280.

In addition, according to an embodiment of the disclosure, although not illustrated in the drawings, the fixing rib 243 may include one connected shape (e.g., a H shape). The fixing rib 243 may be formed in an amount corresponding to the coupling protrusion 251. For example, the number of the fixing rib 243 may be twice the number of the coupling protrusion 251. Two fixing ribs 243 may be provided on a single coupling protrusion 251.

In addition, the shape of each of the plurality of fixing ribs 243 and the coupling protrusion 251 is not limited to those illustrated in the above examples or drawings, and the plurality of fixing ribs 243 may have different shapes for each other or different shapes for each pair. Further, the number of the fixing ribs 243 and/or the coupling protrusions 251 is not limited to those illustrated in the drawings.

According to an embodiment of the disclosure, the first fixing rib 243*a* may include a recess 244. The recess 244 may accommodate the fastening pin 280. The recess 244 may be formed to be recessed from the second side 243*ab* to accommodate the fastening pin 280.

According to an embodiment of the disclosure, the recess 244 may include a contact surface 244*a*, a plurality of constraining surfaces 244*b*, and an accommodating portion 244*c*. In response to the fastening pin 280 coupled to the housing 240, the recess contact surface 244*a* and a fastening pin contact surface 281 may be in contact with each other. The recess contact surface 244*a* may be formed in a flat shape to correspond to the fastening pin contact surface 281. However, as long as the recess contact surface 244*a* and the fastening pin contact surface 281 are in contact with each other to allow fastening pin 280 to stably couple to the housing 240, the shape of the contact surface is not limited to the above example. The recess contact surface 244*a* may be a first contact surface 244*a*. The fastening pin contact surface 281 may be a second contact surface. The plurality of constraining surfaces 244*b* may be respectively provided on upper and lower sides of the contact surface 244*a*. For example, the plurality of constraining surfaces 244*b* may be provided in the Z direction and the −Z direction of the contact surface 244*a*, respectively. Accordingly, in response to the fastening pin 280 coupled to the housing 240, the plurality of constraining surfaces 244*b* may constrain the movement in the Z direction of the fastening pin 280. Accordingly, the fastening pin 280 may be stably coupled to the housing 240 without the fastening pin 280 separating in the Z direction. In response to fastening pin 280 coupling to the housing 240, a portion of the fastening pin 280 may be accommodated in the accommodating portion 244*c*. In response to the fastening pin 280 coupling to the housing 240, the accommodating portion 244*c* may accommodate a portion of the fastening pin 280.

Figure 5:
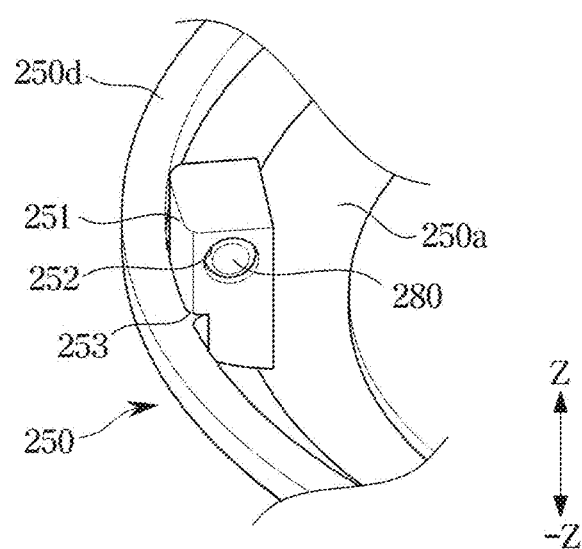
FIG. 5 is a perspective view of the electronic device according to the various embodiments of the disclosure.

FIG. 5 is a perspective view of the electronic device according to the various embodiments of the disclosure.

For example, FIG. 5 is a perspective view illustrating a portion B in the electronic device illustrated in FIG. 3.

Referring to FIG. 5, according to an embodiment of the disclosure, the cover 250 may include a lower surface 250*a*, a housing mounting portion 250*d*, the coupling protrusion 251, a coupling hole 252, and a strength reinforcement portion 253.

According to an embodiment of the disclosure, the lower surface 250*a* may support a lower portion of the coupling protrusion 251. The housing mounting portion 250*d* may be provided in a shape corresponding to the housing 240 to allow the housing 240 to be mounted on the upper side. The housing mounting portion 250*d* may be formed around the lower surface 250*a*.

According to an embodiment of the disclosure, the coupling protrusion 251 may protrude from the lower surface 250*a* of the cover. The coupling protrusion 251 may be provided adjacent to the outside of the lower surface 250*a* and protrude upward toward the display. A formation position of the coupling protrusion 251 in the lower surface 250*a* may be freely arranged in various positions regardless of the band coupling portion 241. Accordingly, an arrangement space of the configuration such as the printed circuit board 230 provided in the housing 240 may be free. In addition, the shape of the housing 240 to be coupled to the coupling protrusion 251 may be simplified, thereby increasing productivity and reducing production costs. For example, the fastening pin 280 may be coupled to the housing 240 through the simple structure such as the fixing rib (e.g., the fixing rib 243 in FIG. 4) and the recess (e.g., the recess 244 in FIG. 4) formed in the housing 240, and thus it is possible to increase the productivity.

According to an embodiment of the disclosure, in response arranging to the housing 240 on the upper side of the cover 250, the coupling protrusion 251 may be arranged between the fixing ribs 243. The strength reinforcement portion 253 may be arranged on opposite sides of the coupling protrusion 251 to reinforce the strength to allow the cover 250 to support the fixing rib 243. The strength reinforcement portion 253 may be provided on opposite sides of the support protrusion, respectively. For example, the strength reinforcement portion 253 may be provided in plural.

According to an embodiment of the disclosure, the coupling hole 252 may be formed in the coupling protrusion 251. The fastening pin 280 may be arranged inside the coupling hole 252. The fastening pin 280 may be movable in the coupling hole 252. Accordingly, the fastening pin 280 may be coupled to and separated from the housing 240, and the cover 250 may be coupled to and separate from the housing 240.

Figure 6:
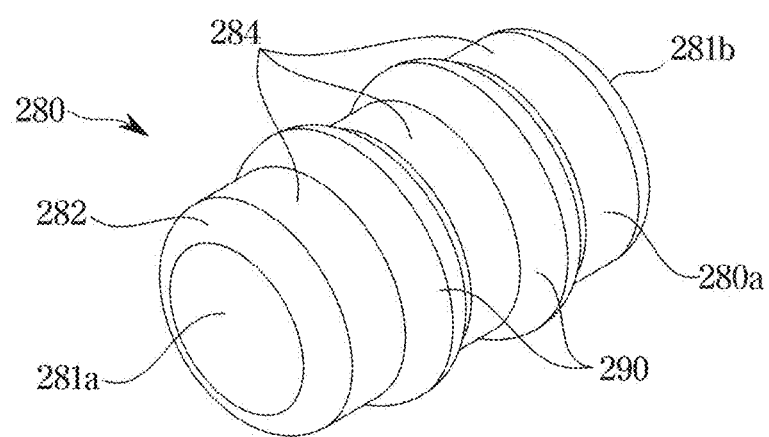
FIG. 6 is a perspective view illustrating a fastening pin and a sealing member in the electronic device according to one of the various embodiments of the disclosure.

FIG. 6 is a perspective view illustrating a fastening pin and a sealing member in the electronic device according to one of the various embodiments of the disclosure.

Referring to FIG. 6, according to an embodiment of the disclosure, the electronic device may include the fastening pin 280. The fastening pin 280 may allow a housing (e.g., the housing 240 of FIG. 3) and a cover (e.g., the cover 250 of FIG. 3) to be coupled to each other. The fastening pin 280 may include a cylindrical shape extending in one direction. The fastening pin 280 may include a fastening pin contact surface 281, an outer surface 284, and a rounding portion 282. The fastening pin contact surface 281 may include a first surface 281a and a second surface 281b. The first surface 281a may be a surface in contact with a recess contact surface (e.g., the recess contact surface 244a of FIG. 4) in response to the fastening pin 280 coupled to the housing 240. In response to the recess contact surface 244a and the first surface 281a in contact with each other, the fastening pin 280 may be no longer moved toward the recess (e.g., the recess 244 of FIG. 4). The second surface 281b may be a surface in contact with a contact surface 252b of the coupling hole in response to fastening pin 280 separating from the housing 240. In response to the second surface 281b in contact with a coupling hole contact surface (e.g., the coupling hole contact surface 252b of FIG. 9), the fastening pin 280 may be no longer moved toward a communication path 255. Details will be described later. The rounding portion 282 may be formed at both ends from which a coupling body 280a extends. The rounding portion 282 may allow the fastening pin 280 to be moved in response to pressurizing air.

According to an embodiment of the disclosure, a sealing member 290 may be coupled to the outside of the fastening pin 280. In response to the fastening pin 280 being arranged in the coupling hole 252, the sealing member 290 may be compressed in the coupling hole 252. The sealing member 290 may prevent the fastening pin 280 from moving in a state in which the fastening pin 280 is arranged in the coupling hole 252. Accordingly, it is possible to prevent the housing 240 and the fastening pin 280 from unexpectedly separating. In addition, the sealing member 290 may seal the space between the fastening pin 280 and the coupling hole 252 to prevent water and/or foreign substances (e.g., dust) from entering the housing 240. For example, recently, a waterproof function has been required for electronic devices, and the sealing member 290 may prevent water from flowing into the housing 240. In addition, air may be pressurized in order to couple the fastening pin 280 to the housing 240 and air may be sucked in order to separate the fastening pin 280 from the housing 240, air may be sucked. Accordingly, the sealing member 290 may act as a seal so as to allow the fastening pin to couple to or separate from the housing 240. Details will be described later.

In addition, the sealing member 290 may include a material having elasticity. For example, the sealing member 290 may include rubber or silicone. However, the disclosure is not limited thereto, and the sealing member 290 may include various materials having elasticity. The sealing member may include an annular shape.

In addition, although two sealing members 290 are illustrated in the drawing, the number of sealing members 290 is not limited thereto. For example, one or three or more sealing members 290 may be provided.

Figure 7:
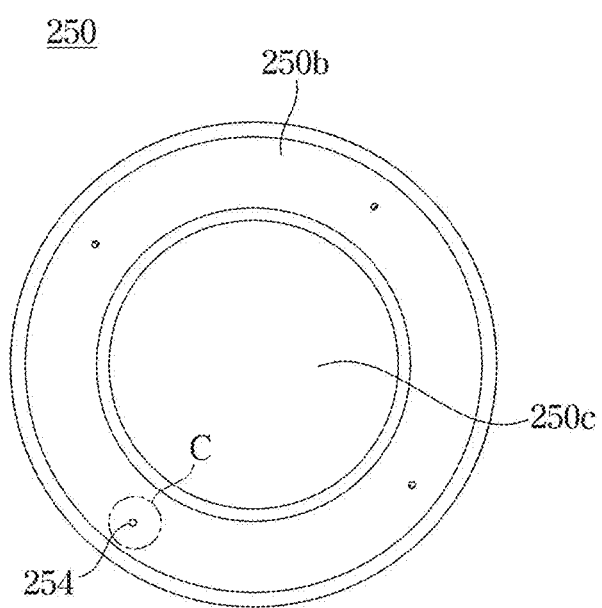
FIG. 7 is a rear view illustrating a cover in the electronic device according to one of the various embodiments of the disclosure.

FIG. 7 is a rear view illustrating a cover in the electronic device according to one of the various embodiments of the disclosure.

For example, FIG. 7 is a view illustrating the cover 250 of FIG. 3 as viewed from the −Z direction to the +Z direction.

Referring to FIG. 7, according to an embodiment of the disclosure, the cover 250 may include an air hole 254. The air hole 254 may be formed in the outer surface 250b of the cover 250. The air hole 254 may move the fastening pin (e.g., the fastening pin 280 of FIG. 6) through a pressurizer (e.g., a pressurizer 300 of FIG. 10) to be described later, so as to allow the fastening pin 280 to couple to and separate from the housing 240 and the fastening pin 280. For example, air may move the fastening pin 280 through the air hole 254 and a communication path (e.g., the communication path 255 of FIG. 9). Because the housing 240 and the cover 250 are coupled to each other in a simple manner, the productivity of the electronic device may be increased. In addition, a position at which a coupling protrusion (e.g., the coupling protrusion 251 in FIG. 5) is formed is not limited and a structure for reinforcing the strength of the outer surface 250b of the cover is not required. Accordingly, the outer surface 250b of the cover may be formed in a smooth shape without the protrusion. Further, in response to the fastening pin 280 coupling to the housing 240, the fastening pin 280 may not be seen through the air hole 254. Accordingly, a producer and/or a user can recognize that the fastening pin 280 is coupled to the housing 240, and the appearance of the cover 250 may be improved. Details will be described later.

According to an embodiment of the disclosure, the cover 250 may include a back glass mounting portion 250c. The back glass mounting portion 250c may be formed as a recess in the outer surface 250b. A back glass (e.g., the back glass 260 of FIG. 3) may be mounted on the back glass mounting portion 250c.

Figure 8:
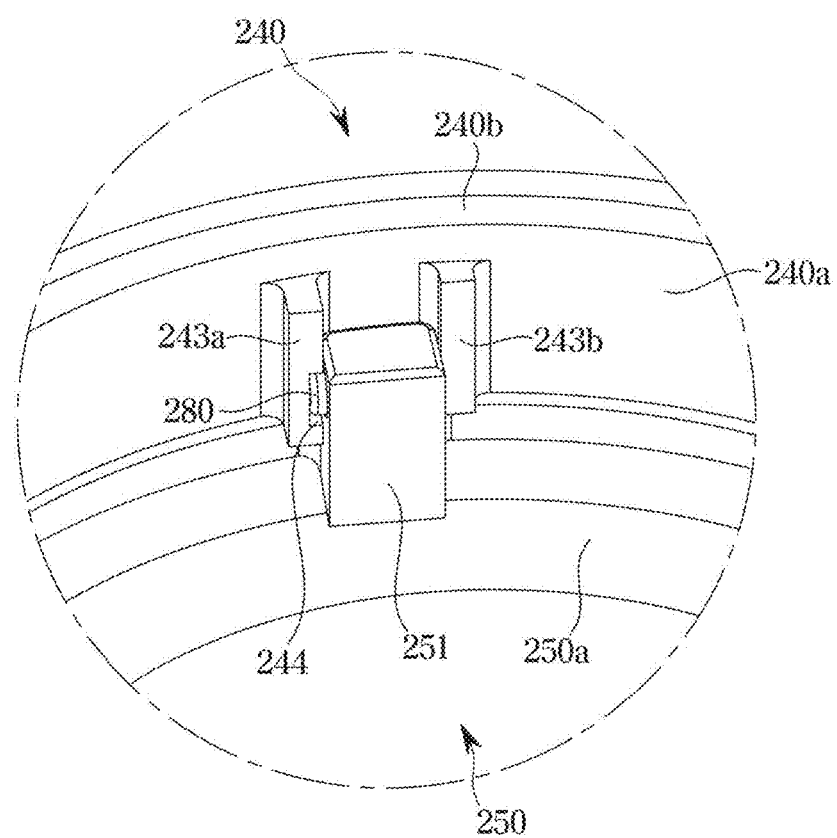
FIG. 8 is a perspective view illustrating a state in which a housing and the fastening pin are coupled to each other in the electronic device according to one of the various embodiments of the disclosure.
Figure 9:
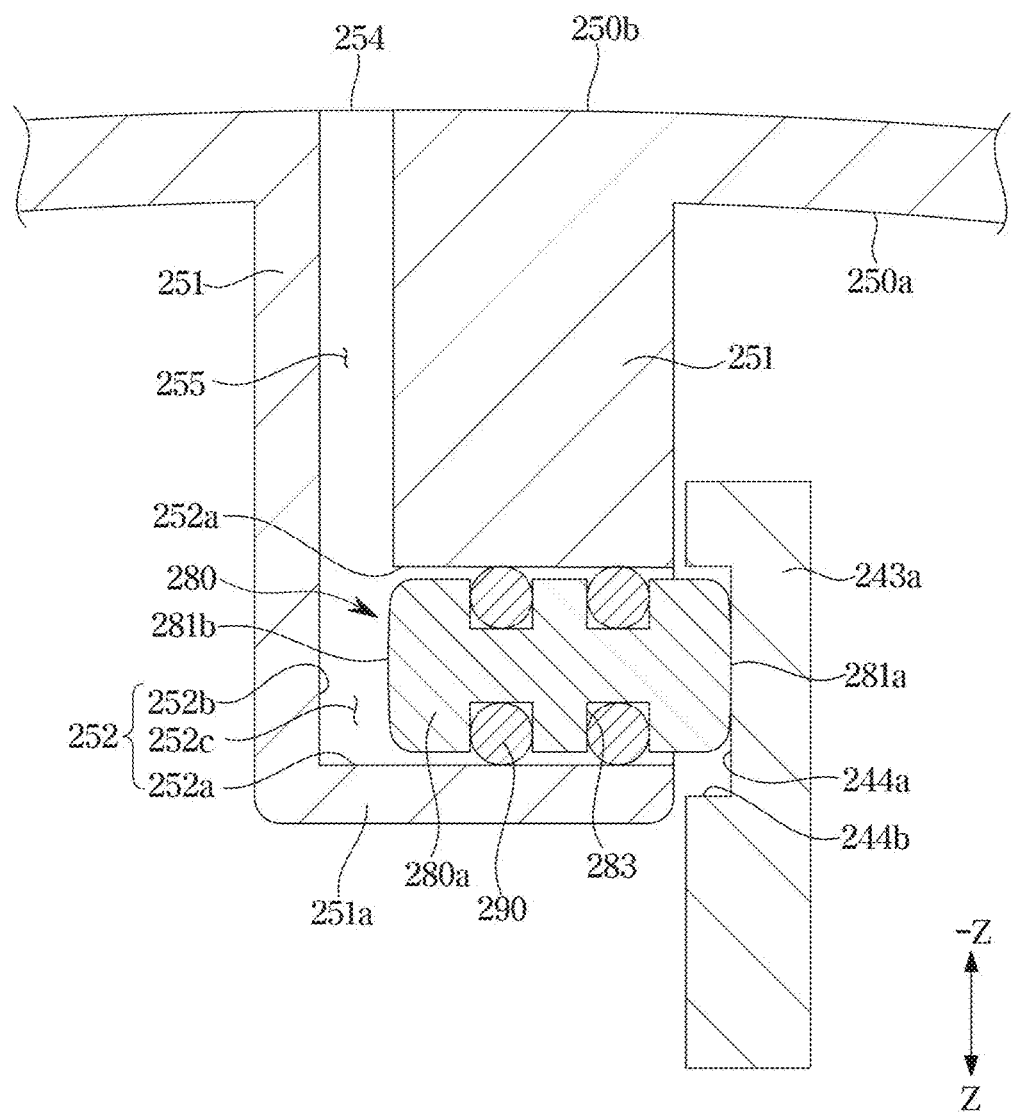
FIG. 9 is a cross-sectional view illustrating a state in which the housing and the fastening pin are coupled to each other in the electronic device according to the various embodiments of the disclosure.

FIG. 8 is a perspective view illustrating a state in which fastening pin 280 is coupled to the housing 240 in the electronic device according to one of the various embodiments of the disclosure. FIG. 9 is a cross-sectional view illustrating a state in which the fastening pin 280 is coupled to the housing 240 in the electronic device according to the various embodiments of the disclosure.

Referring to FIGS. 8 and 9, according to an embodiment of the disclosure, the cover 250 may include a coupling hole 252. The coupling hole 252 may be provided in the coupling protrusion 251. The fastening pin 280 may be accommodated in an inner wall 252a forming the coupling hole 252. The coupling hole 252 may be covered by an upper wall 251a of the coupling protrusion 251. For example, the coupling hole 252 may be provided to penetrate the coupling protrusion 251 in a direction perpendicular to the coupling protrusion 251. The coupling hole 252 may extend in a direction perpendicular to the protrusion direction of the fixing rib 243. The coupling hole 252 may extend to allow the fastening pin contact surface to face the second side 243ab of the first fixing rib 243a. For example, the coupling hole 252 may extend in a direction perpendicular to the coupling protrusion 251 and the first fixing rib 243a, respectively. Accordingly, the fastening pin 280 may be in contact with the recess contact surface 244a and thus a movement distance of the fastening pin 280 may be limited and the fastening pin 280 may be coupled to the housing 240 at an appropriate position.

According to an embodiment of the disclosure, the coupling hole 252 may include the inner wall 252a, the coupling hole contact surface 252b, and an accommodating space 252c. The inner wall 252a may form the coupling hole 252. The inner wall 252a may be in contact with the sealing member 290. For example, a space between the inner wall 252a and the fastening pin 280 may be sealed by the sealing member 290. In addition, in response to the fastening pin 280 coupling to the housing 240, the recess 244 may be in contact with the first surface 281a. Particularly, the recess contact surface 244a may be in contact with the first surface 281a provided on the fastening pin 280. The accommodating space 252c may be connected to the communication path 255 to be described later.

According to an embodiment of the disclosure, the fastening pin 280 may include a sealing groove 283. The sealing groove 283 may be provided as a recess in the coupling body 280a. For example, the sealing groove 283 may be recessed from the outer surface 284 to accommodate the sealing member 290. Accordingly, the sealing member 290 may be stably coupled to the fastening pin 280. According to an embodiment of the disclosure, the sealing member 290 may seal the space between the inner wall 252a forming the coupling hole 252 and the fastening pin 280. The sealing member 290 may prevent the fastening pin 280 from moving in the state in which the fastening pin 280 is arranged in the coupling hole 252. Accordingly, the fastening pin can be prevented from unexpectedly separating from the housing 240. In addition, the sealing member 290 may seal the space between the fastening pin 280 and the coupling hole 252 to prevent water from flowing into the housing 240. For example, recently, a waterproof function has been required for electronic devices, and thus the sealing member 290 may prevent water from flowing into the housing 240. The sealing groove 283 may be formed to correspond to the number and shape of the sealing members 290.

According to an embodiment of the disclosure, the coupling protrusion 251 may be arranged between the plurality of fixing ribs 243. In a state in which the housing 240 and the fastening pin 280 are coupled, a portion of the fastening pin 280 may be accommodated in the coupling hole 252. For example, a portion of the coupling body may be accommodated in the accommodating space 252c. In addition, the other portion of the fastening pin 280 may be accommodated in the recess 244. For example, the other portion of the coupling body may be accommodated in the accommodating portion 244c. Accordingly, the fastening pin 280 may be coupled to the housing 240, and the cover 250 may be coupled to the housing 240.

According to an embodiment of the disclosure, in response to fastening pin 280 coupling to the housing 240, the first surface 281a may be in contact with the recess contact surface 244a. The fastening pin 280 may be no longer moved to the side out of the coupling hole 252, a portion of the coupling body may be accommodated in the accommodating space 252c, and the other portion thereof may be accommodated in the recess 244. Accordingly, cover 250 may be coupled to the housing 240. In addition, the plurality of constraining surfaces 244b may be provided in each of the Z direction and the −Z direction of the fastening pin 280 to restrict the Z direction movement of the fastening pin 280. Accordingly, in the state in which the fastening pin 280 is coupled to the housing 240, the fastening pin 280 may not be separated in the Z direction. Even when the fastening pin 280 is shaken in the coupling hole 252 due to an unexpected external force, the housing 240 and the fastening pin 280 may be stably coupled due to the plurality of constraining surfaces 244b. The position of the fastening pin 280 coupled to the housing 240 may be referred to as a first position.

Figure 10:
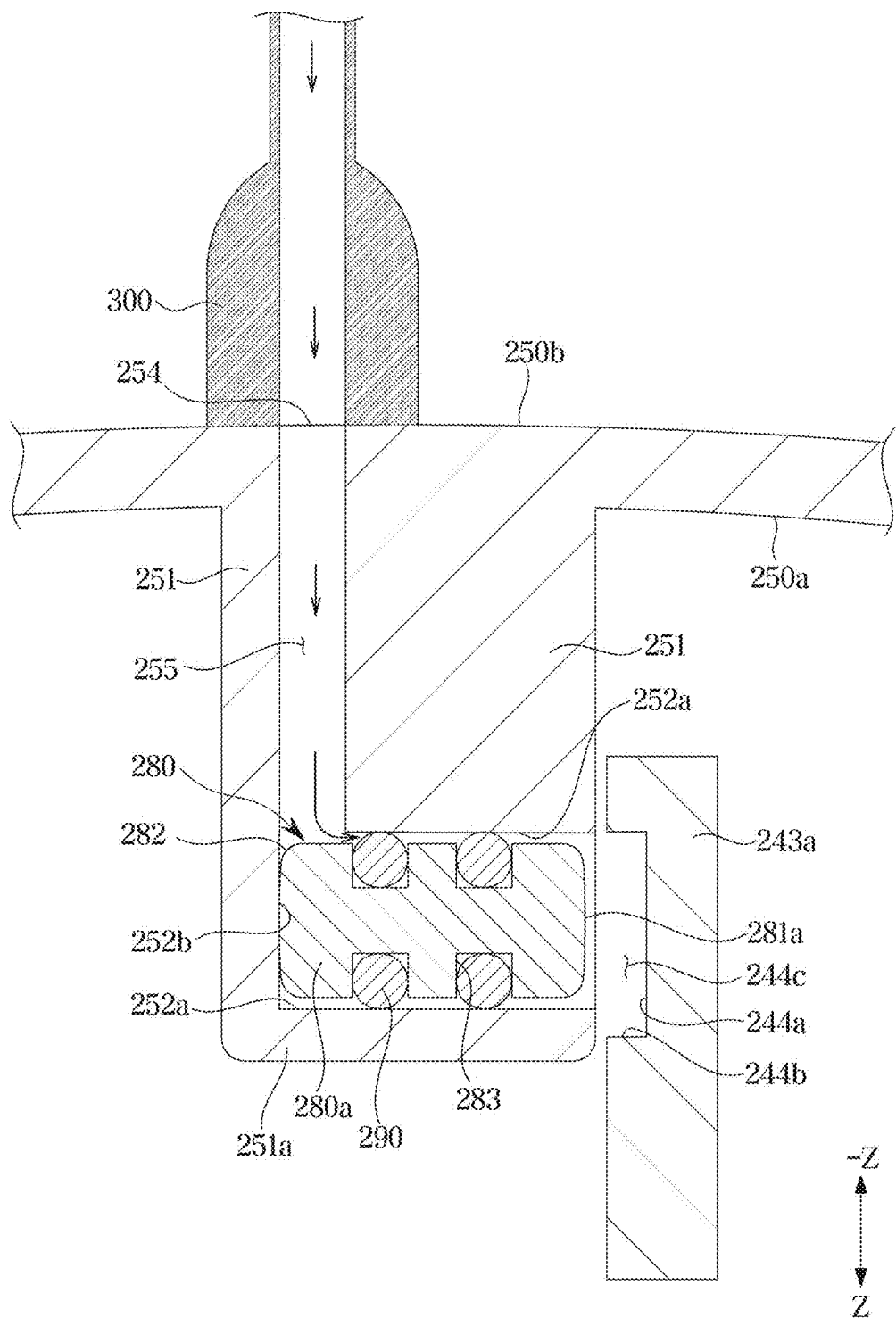
FIG. 10 is a cross-sectional view illustrating a process in which the housing and the fastening pin are coupled to each other in the electronic device according to one of the various embodiments of the disclosure.
Figure 11:
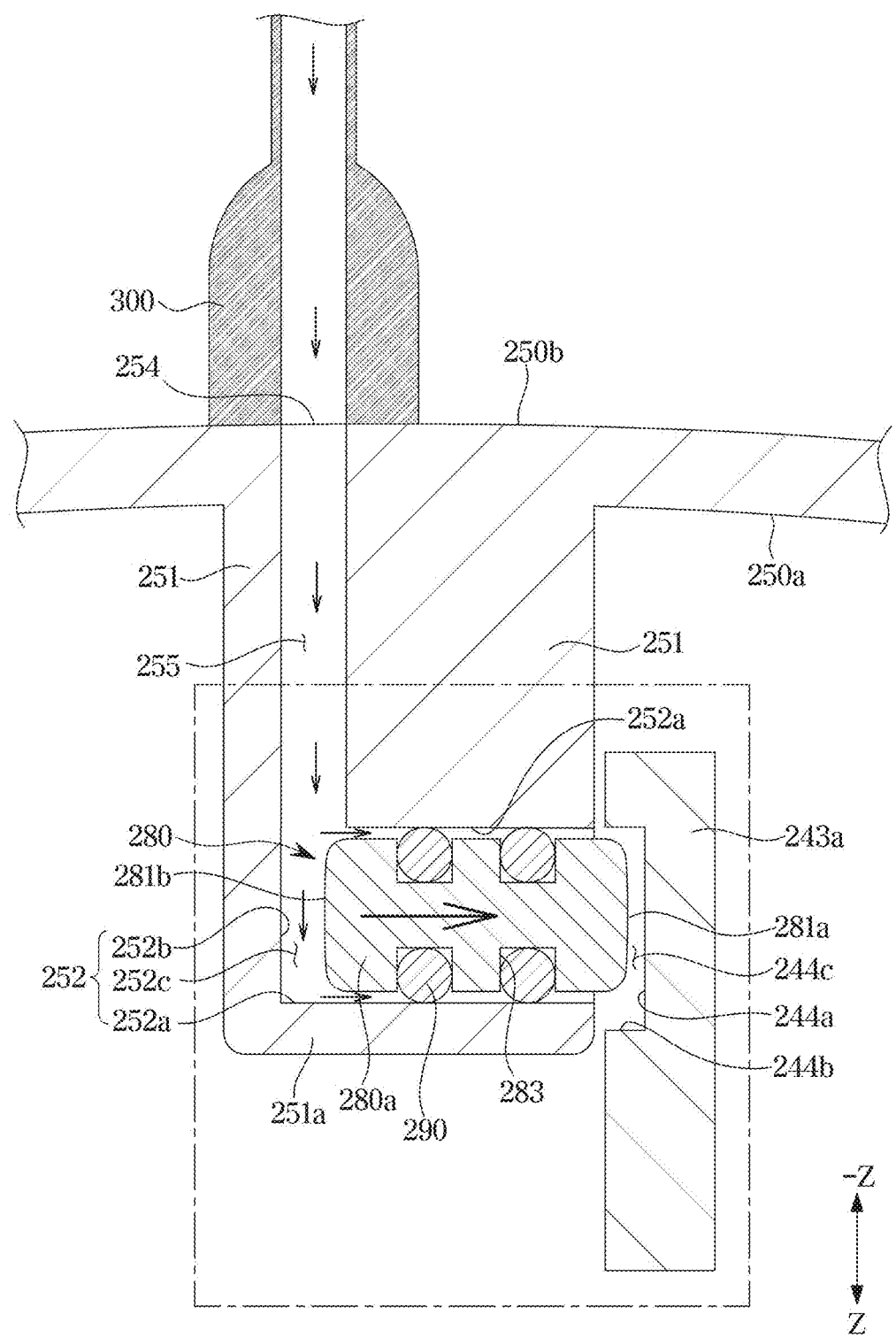
FIG. 11 is a cross-sectional view illustrating the process in which the housing and the fastening pin are coupled to each other in the electronic device according to one of the various embodiments of the disclosure.
Figure 12:
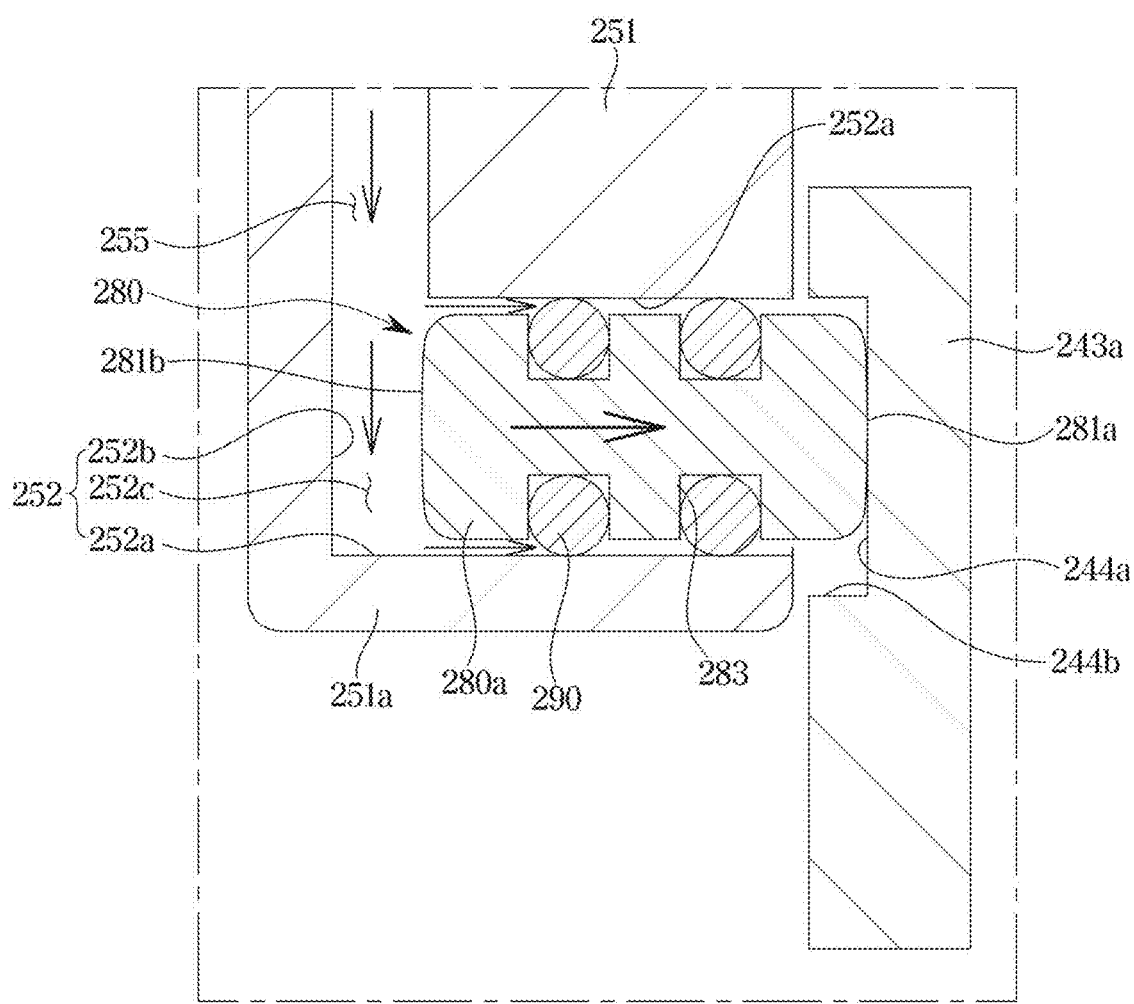
FIG. 12 is a cross-sectional view illustrating the process in which the housing and the fastening pin are coupled to each other in the electronic device according to one of the various embodiments of the disclosure.
Figure 13:
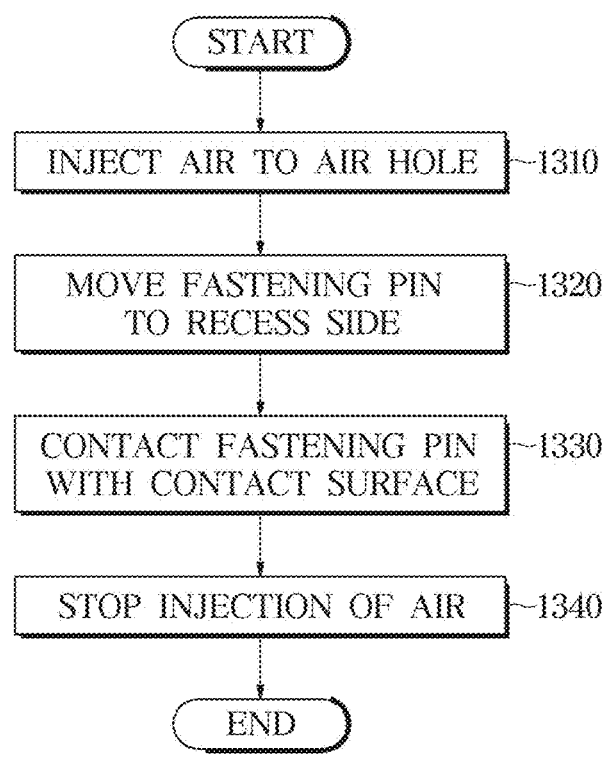
FIG. 13 is a flowchart illustrating the process in which the housing and the fastening pin are coupled to each other in the electronic device according to one of the various embodiments of the disclosure.

FIGS. 10 to 12 are cross-sectional views illustrating a process in which the fastening pin is coupled to the housing in the electronic device according to one of the various embodiments of the disclosure. FIG. 13 is a flowchart illustrating the process in which the fastening pin is coupled to the housing in the electronic device according to one of the various embodiments of the disclosure.

Referring to FIGS. 10 to 13, according to an embodiment of the disclosure, the pressurizer 300 may be arranged on the outer surface 250b of the cover 250. In addition, the cover 250 may include the communication path 255 connected to the air hole 254 and the coupling hole 252, respectively. The communication path 255 may be connected at one end of the coupling hole 252. For example, the air hole 254 may be an inlet and/or an outlet of the communication path 255. The communication path 255 may be connected to a region adjacent to the coupling hole contact surface 252b to allow air to flow through the coupling hole 252. The pressurizer 300 may inject air into the air hole 254 to move the fastening pin 280 toward the recess 244 side.

According to various embodiments of the present disclosure, as for an assembling method (e.g., a manufacturing method of the electronic device 200) of an electronic device (e.g., the electronic device 200 of FIG. 2), the housing 240 is arranged, the display 210 is coupled to one side of the housing 240, the cover 250, in which the coupling pin 280 is accommodated, is arranged at the other side of the housing 240, and the coupling pin is coupled to the housing 240. Accordingly, the electronic device 200 may be assembled. However, the order, in which the housing 240, the display 210, or the cover 250 are arranged, may be changed.

Hereinafter a process in which the housing 240 and the fastening pin 280 are coupled will be described with reference to FIG. 13. According to an embodiment of the disclosure, the pressurizer 300 may inject air into the air hole 254 (1310). Air injected into the air hole 254 may flow to the fastening pin 280 through the communication path 255. The air flowing toward the fastening pin 280 may press the rounding portion 282 and the sealing member 290 mounted on the fastening pin 280. Because air flows from the coupling hole 252 toward the recess 244 side, the fastening pin 280 and the sealing member 290 may be also moved toward the recess 244 side (1320). In this case, the sealing member 290 may seal the space between the inner wall 252a forming the coupling hole 252 and the coupling body 280a. Therefore, the air may not be discharged into the space between the inner wall 252a and the fastening pin 280 and may press the sealing member 290 to move the fastening pin 280 and the sealing member 290. As illustrated in FIG. 11, a space may be formed between the coupling hole contact surface 252b and the second surface 281b as the fastening pin 280 and the sealing member 290 are moved toward the recess 244 side. As illustrated in FIG. 12, the first surface 281a may come into contact with the recess contact surface 244a, thereby stopping the movement of the fastening pin 280 (1330). In this case, it can be seen that the housing 240 and the fastening pin 280 are coupled, and the housing 240 and the cover 250 are coupled. In response to the completion of the coupling of the housing 240 and the cover 250, it is possible to stop the injection of air into the air hole 254 through the pressurizer 300 (1340).

Figure 14:
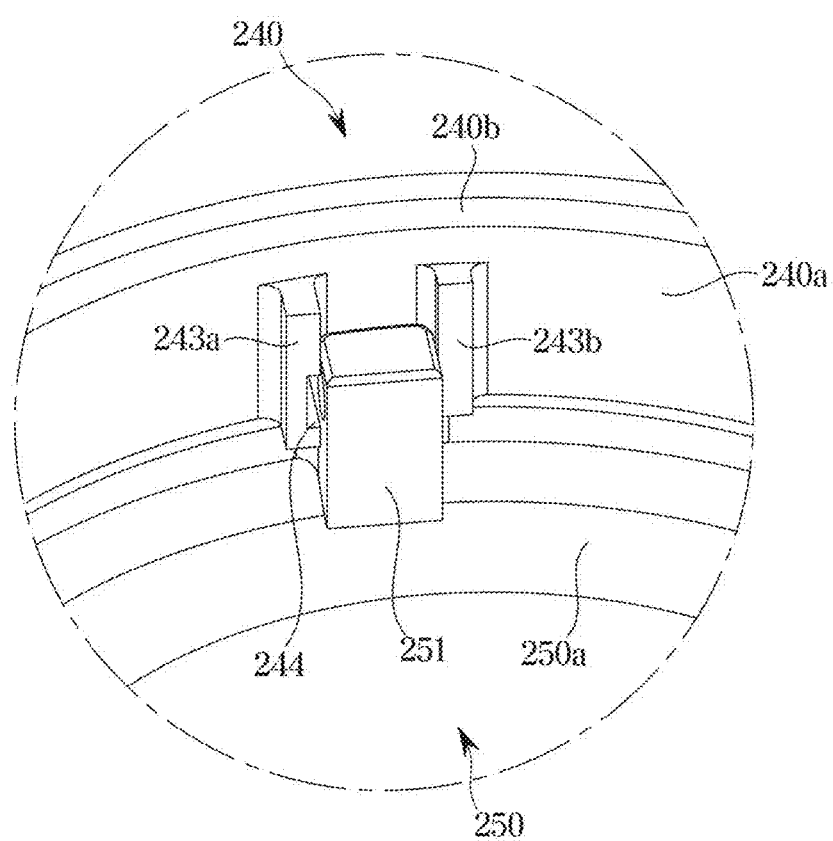
FIG. 14 is a perspective view illustrating a state in which the housing and the fastening pin are separated from each other in the electronic device according to one of the various embodiments of the disclosure.
Figure 15:
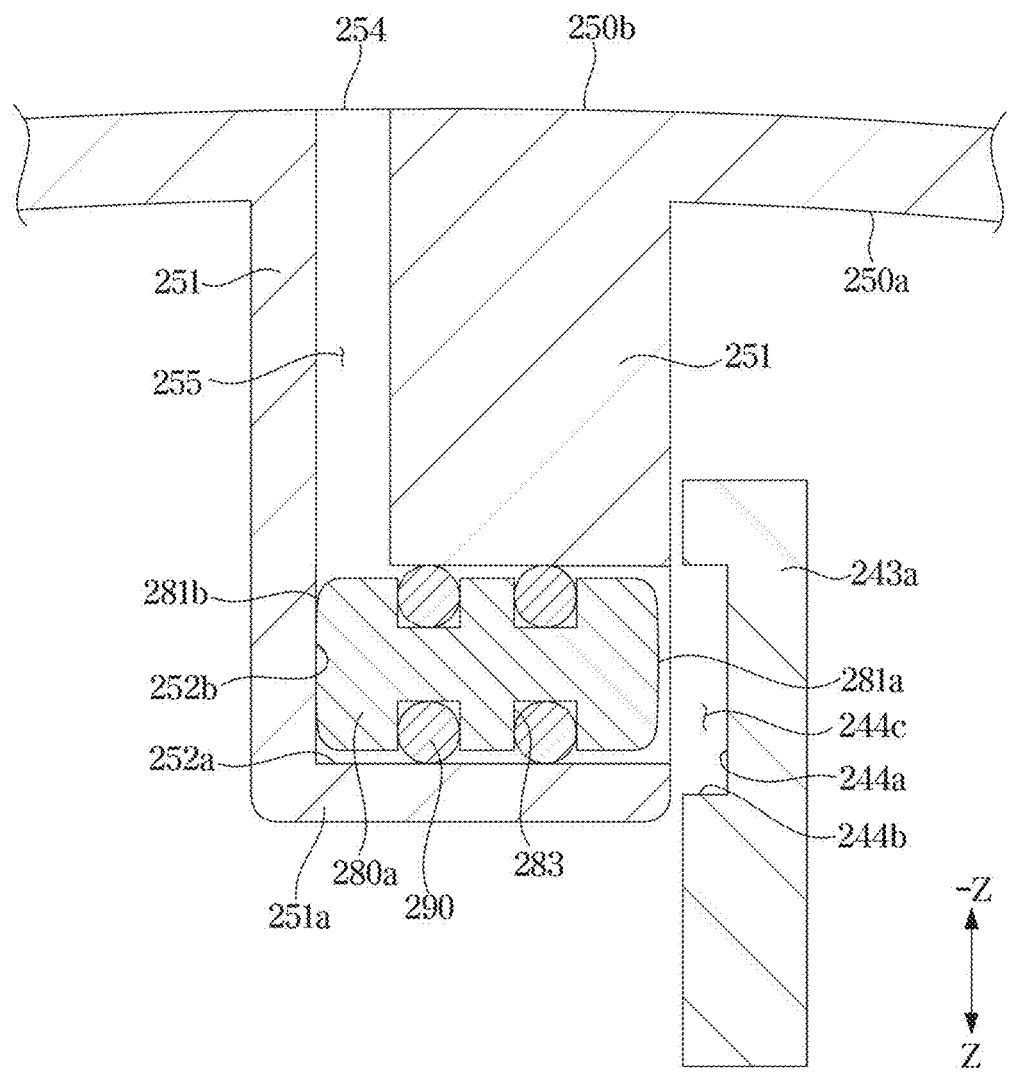
FIG. 15 is a cross-sectional view illustrating a state in which the housing and the fastening pin are separated from each other in the electronic device according to one of the various embodiments of the disclosure.

FIG. 14 is a perspective view illustrating a state in which the housing and the fastening pin are separated from each other in the electronic device according to one of the various embodiments of the disclosure. FIG. 15 is a cross-sectional view illustrating a state in which the housing and the fastening pin are separated from each other in the electronic device according to one of the various embodiments of the disclosure.

Referring to FIGS. 14 and 15, according to an embodiment of the disclosure, in response to the fastening pin separating from the housing 240, the coupling hole contact surface 252b may be in contact with the second surface 281b. For example, the coupling hole contact surface 252b may be in contact with the second surface 281b. The accommodating space 252c may be provided to accommodate the fastening pin 280. The fastening pin 280 may be moved toward the communication path 255. The entire coupling body 280a may be accommodated in the accommodating space 252c. For example, the fastening pin 280 may not be accommodated in the accommodating portion 244c of the recess, but may be accommodated only in the coupling hole 252. Accordingly, the recess contact surface 244a may not be in contact with the plurality of constraining surfaces 244b and the housing 240 may be separated from the cover 250. The position of the fastening pin 280 separated from the housing 240 may be referred to as a second position.

Figure 16:
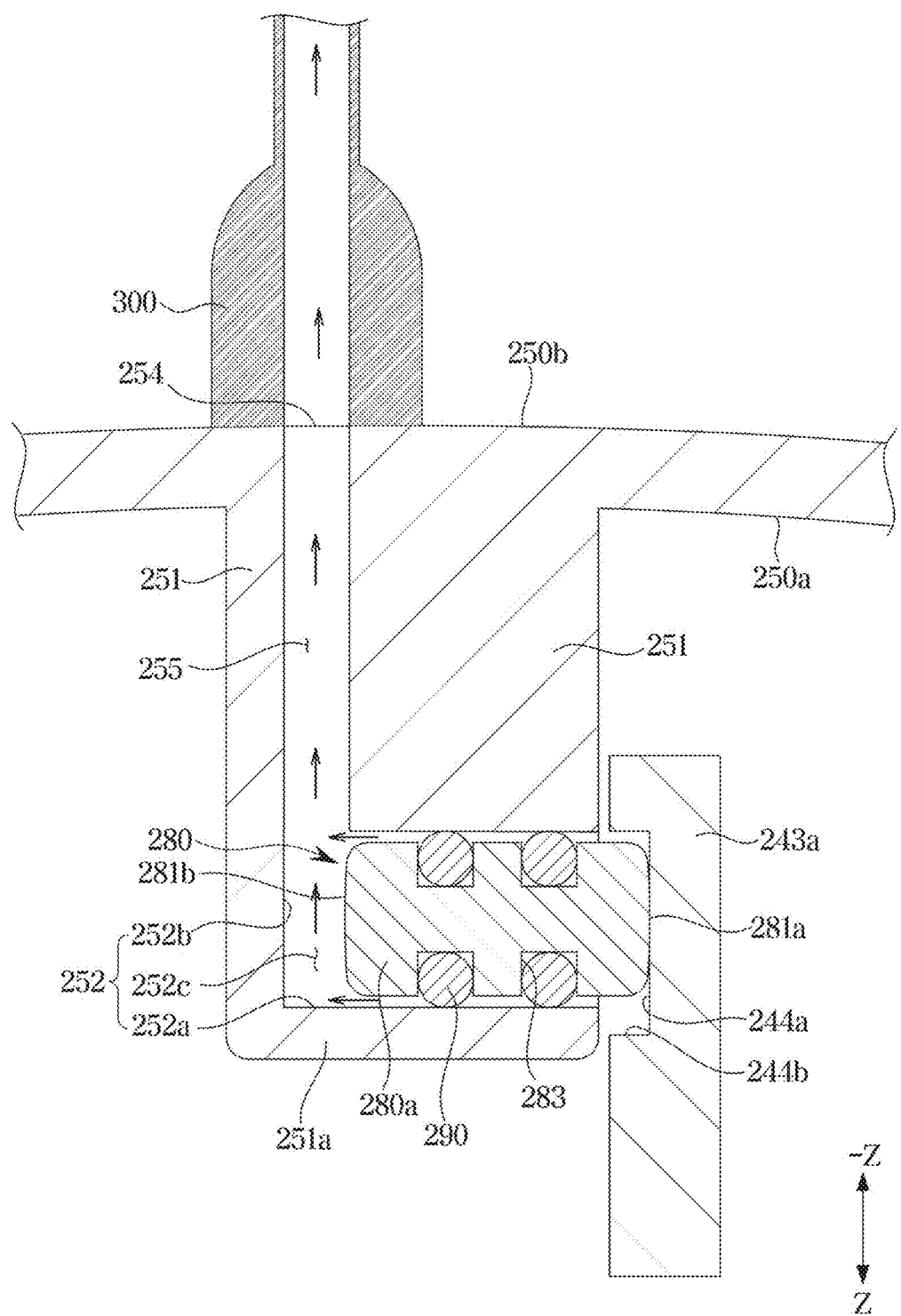
FIG. 16 is a cross-sectional view illustrating the process in which the housing and the fastening pin are separated from each other in the electronic device according to one of the various embodiments of the disclosure.
Figure 17:
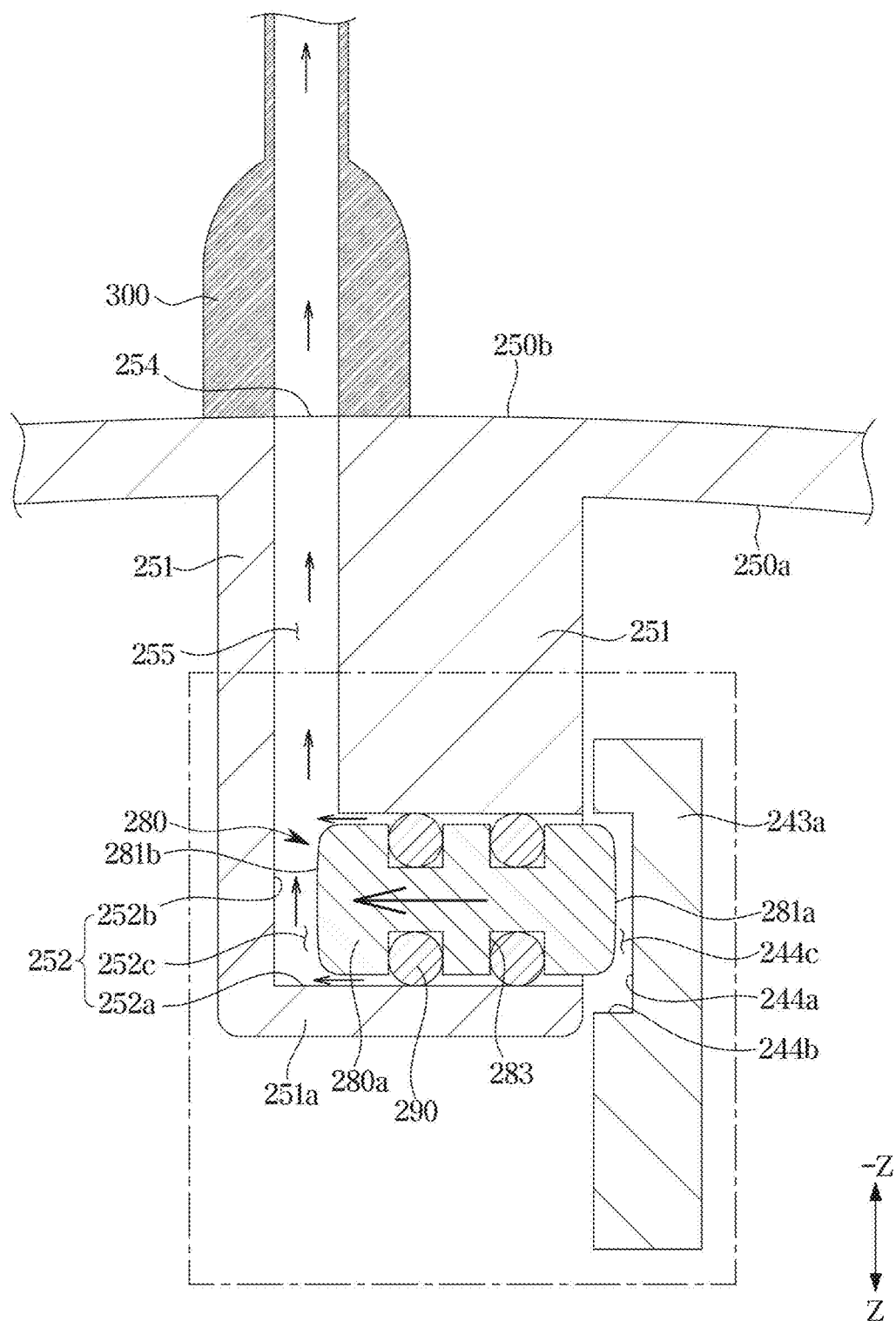
FIG. 17 is a cross-sectional view illustrating the process in which the housing and the fastening pin are separated from each other in the electronic device according to one of the various embodiments of the disclosure.
Figure 18:
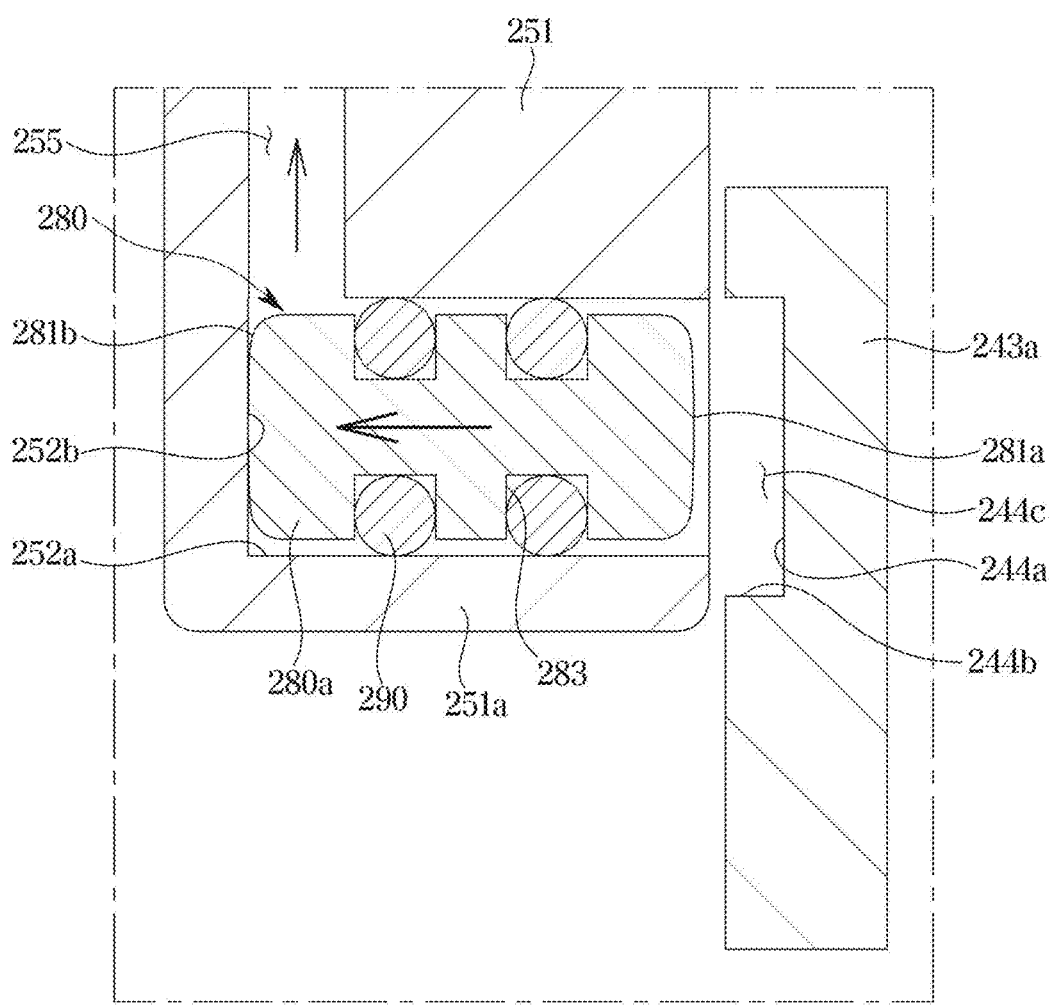
FIG. 18 is a cross-sectional view illustrating the process in which the housing and the fastening pin are separated from each other in the electronic device according to one of the various embodiments of the disclosure.
Figure 19:
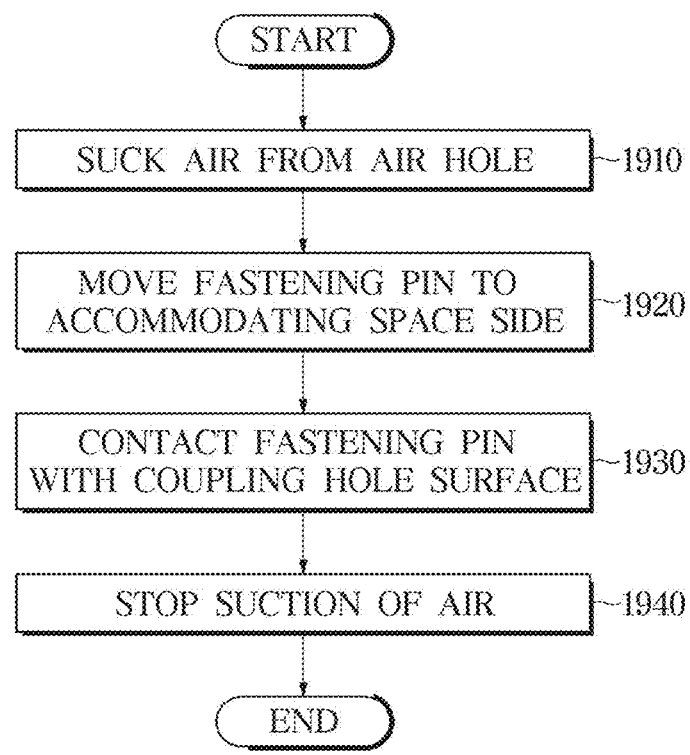
FIG. 19 is a flowchart illustrating the process in which the housing and the fastening pin are separated from each other in the electronic device according to one of the various embodiments of the disclosure.

FIGS. 16 to 18 are cross-sectional views illustrating a process in which the fastening pin is coupled to the housing in the electronic device according to one of the various embodiments of the disclosure. FIG. 19 is a flowchart illustrating the process in which the housing and the fastening pin are separated from each other in the electronic device according to one of the various embodiments of the disclosure.

Referring to FIGS. 16 to 19, according to an embodiment of the disclosure, the pressurizer 300 may be arranged on the outer surface 250b of the cover 250. The pressurizer 300 may suck air through the air hole 254 and the communication path 255 to allow the fastening pin 280 to be moved toward the accommodating space 252c side.

Hereinafter a process in which the housing 240 and the fastening pin 280 are separated from each other will be described with reference to FIG. 19. According to an embodiment of the disclosure, the pressurizer 300 may suck air through the air hole 254 (1910). In response to sucking air through the air hole 254, air present in the communication path 255 and the accommodating space 252c may also be sucked. Air is sucked into the communication path 255 and the air hole 254 through the pressurizer 300, and the sealing member seals the space between the fastening pin 280 and the inner wall 252a to prevent air from leaking. Accordingly, a difference in air pressure may occur between the accommodating space 252c and recess 244. For example, the accommodating space 252c connected to the communication path 255 may have a lower pressure than the accommodating portion 244c. According to the pressure difference, the fastening pin 280 may be pressed toward the accommodating space 252c side connected to the communication path 255. Accordingly, the fastening pin 280 may be moved toward the accommodating space 252c side connected to the communication path 255 (1920). In this case, the sealing member may seal the space between the inner wall 252a forming the coupling hole 252 and the coupling body 280a. Therefore, the air may not be discharged into the space between the inner wall 252a and the fastening pin 280, and thus the fastening pin 280 and the sealing member may be moved by the difference in air pressure. As illustrated in FIG. 17, a space may be formed between the recess contact surface 244a and the first surface 281a as the fastening pin 280 and the sealing member are moved toward the accommodating space 252c side. As illustrated in FIG. 18, the second surface 281b may be in contact with the fastening pin contact surface 281 and thus the movement of the fastening pin 280 may be stopped (1930). In this case, it can be seen that the housing 240 and the fastening pin 280 are separated from each other, and the housing 240 and the cover 250 are separated from each other. In response to the completion of the separation of the housing 240 and the cover 250, it is possible to stop the suction of the air through the pressurizer 300 (1940).

Figure 20:
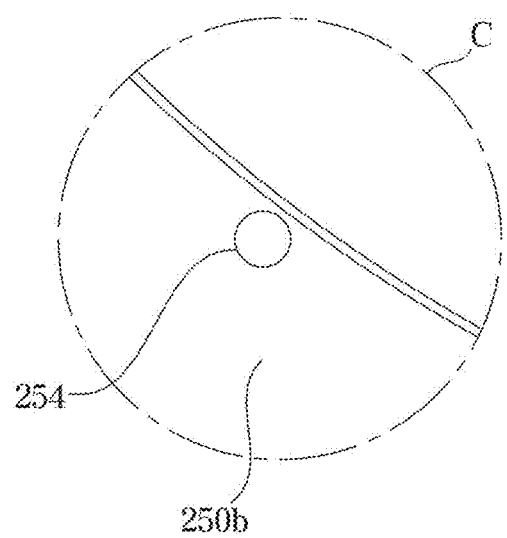
FIG. 20 is a plan view illustrating a state in which the housing and the fastening pin are coupled to each other in the electronic device according to one of the various embodiments of the disclosure.
Figure 21:
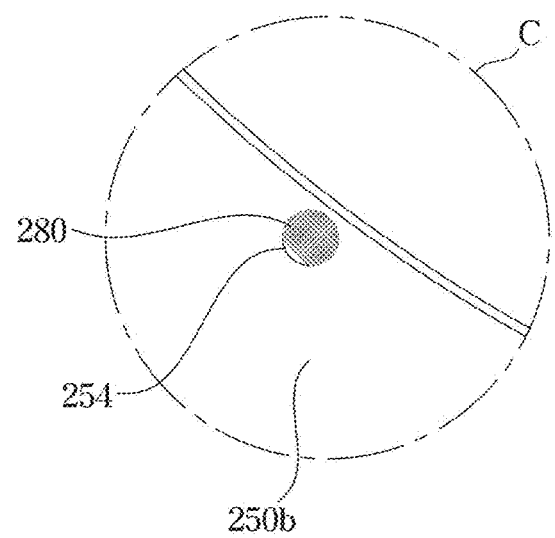
FIG. 21 is a plan view illustrating a state in which the housing and the fastening pin are separated from each other in the electronic device according to one of the various embodiments of the disclosure.

FIG. 20 is a plan view illustrating a portion C in which a state in which the fastening pin is coupled to the housing in the electronic device according to one of the various embodiments of the disclosure. FIG. 21 is a plan view illustrating a portion C in which a state in which the housing and the fastening pin are separated from each other in the electronic device according to one of the various embodiments of the disclosure.

Referring to FIG. 20, according to an embodiment of the disclosure, in response to the completion of the coupling of the housing 240 and the fastening pin 280, the fastening pin 280 may not be seen through the air hole 254. For example, the fastening pin 280 may be coupled to the recess contact surface 244a. The accommodating space 252c may be formed in a region adjacent to the coupling hole contact surface 252b (refer to FIG. 9). In this case, the accommodating space 252c may be a separation space 252c in which the coupling hole contact surface 252b and the fastening pin 280 are spaced apart. An area of the separation space 252c, an area of the communication path 255, and an area of the air hole 254 may be the same or similar. As a result, the fastening pin 280 may be positioned in the coupling hole 252 so as not to be seen through the air hole 254 formed on the outer surface 250b. Accordingly, the producer and/or the user can recognize that the fastening pin 280 is coupled to the housing 240.

Referring to FIG. 21, according to an embodiment of the disclosure, in response to the fastening pin 380 separated from the housing 240, the fastening pin 280 may be seen through the air hole 254. For example, the fastening pin 280 may be coupled to the fastening hole contact surface 252b. As a result, the fastening pin 280 may be positioned in the coupling hole 252 to be seen through the air hole 254 formed in the outer surface 250b. Accordingly, the producer and/or the user can confirm that the housing 240 and the fastening pin 280 are separated from each other.

Figure 22:
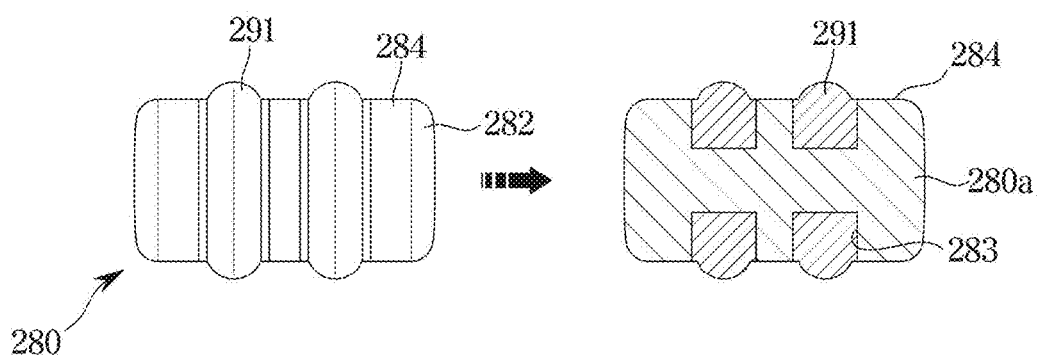
FIG. 22 is a view illustrating a fastening pin and a sealing member in an electronic device according to another of the various embodiments of the disclosure.
Figure 23:
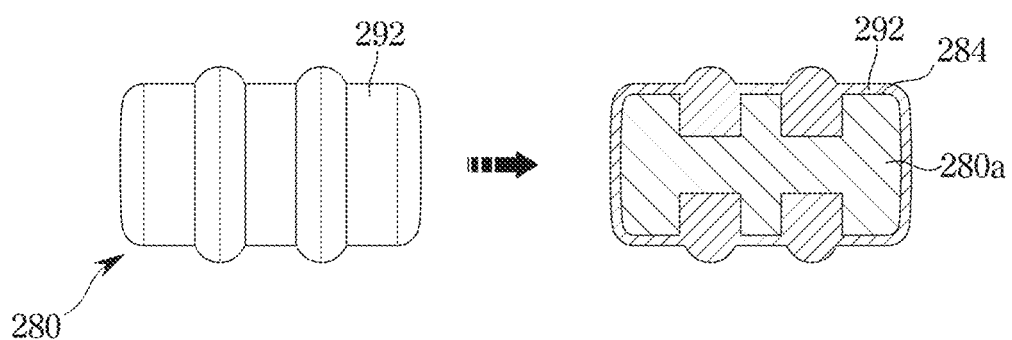
FIG. 23 is a view illustrating a fastening pin and a sealing member in an electronic device according to still another of the various embodiments of the disclosure.
Figure 24:
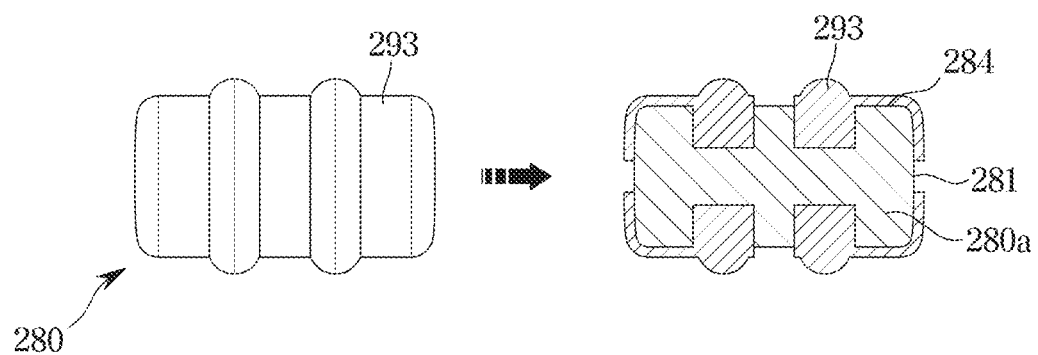
FIG. 24 is a view illustrating a fastening pin and a sealing member in an electronic device according to still another of the various embodiments of the disclosure.

FIG. 22 is a view illustrating a fastening pin and a sealing member in an electronic device according to another of the various embodiments of the disclosure. FIG. 23 is a view illustrating a fastening pin and a sealing member in an electronic device according to still another of the various embodiments of the disclosure. FIG. 24 is a view illustrating a fastening pin and a sealing member in an electronic device according to still another of the various embodiments of the disclosure.

Referring to FIG. 22, according to another embodiment of the disclosure, a fastening pin 280 and a sealing member 291 may be formed by insert injection. For example, it is possible to form the fastening pin 280 and the sealing member 291 at once by insert injection without separately assembling the fastening pin 280 and the sealing member 291.

Referring to FIGS. 23 and 24, according to another embodiment of the disclosure, a fastening pin 280 and sealing members 292 and 293 may be formed by insert injection. For example, the sealing member 292 may be injected into entire outer surface 284 of the fastening pin 280. The sealing member 293 may be injected in such a way that only a portion of the outer surface 284 of the fastening pin is exposed. This may be effective when the fastening pin 280 is insulated from other components. For example, when the housing 240, the cover 250, and the fastening pin 280 are all formed of metal, components inside the housing 240 may be damaged due to an unexpected overcurrent. In this case, the sealing members 292 and 293 may insulate between the components.

Figure 25:
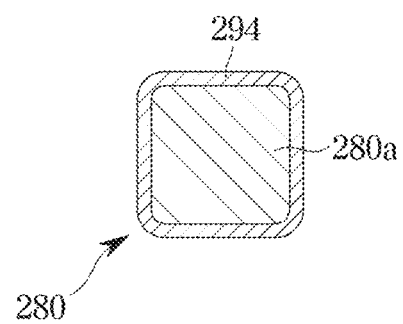
FIG. 25 is a view illustrating a fastening pin and a sealing member in an electronic device according to still another of the various embodiments of the disclosure.
Figure 26:
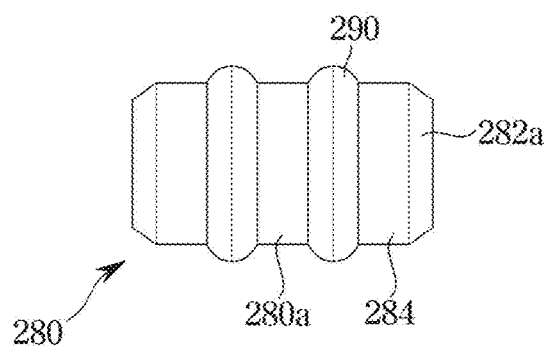
FIG. 26 is a view illustrating a fastening pin and a sealing member in an electronic device according to still another of the various embodiments of the disclosure.
Figure 27:
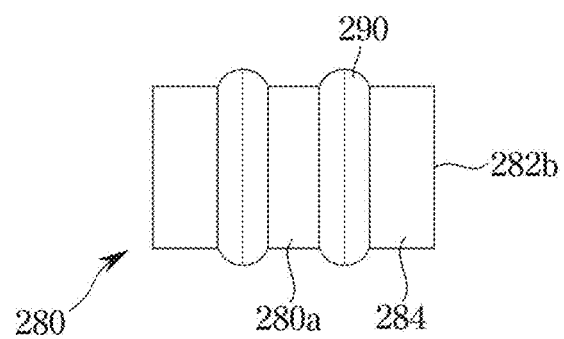
FIG. 27 is a view illustrating a fastening pin and a sealing member in an electronic device according to still another of the various embodiments of the disclosure.

FIG. 25 is a view illustrating a fastening pin and a sealing member in an electronic device according to still another of the various embodiments of the disclosure. FIG. 26 is a view illustrating a fastening pin and a sealing member in an electronic device according to still another of the various embodiments of the disclosure. FIG. 27 is a view illustrating a fastening pin and a sealing member in an electronic device according to still another of the various embodiments of the disclosure.

Referring to FIG. 25, according to still another embodiment of the disclosure, a fastening pin 280 may include various shapes. As an example, the fastening pin 280 may include a quadrangular prism shape. In addition, a sealing member 294 may be provided in a shape corresponding to a shape of an outer surface 284 of the fastening pin 280. The shape of the fastening pin 280 and the sealing member 294 is not limited to the above example and may include various shapes.

Referring to FIGS. 26 and 27, according to still another embodiment of the disclosure, a fastening pin 280 may include a tapered portion 282a and an edge portion 282b. The tapered portion 282a and the edge portion 282b may be formed at both ends from which the coupling body 280a extends. The tapered portion 282a may allow the fastening pin 280 to be moved in response to pressurizing air.

Figure 28:
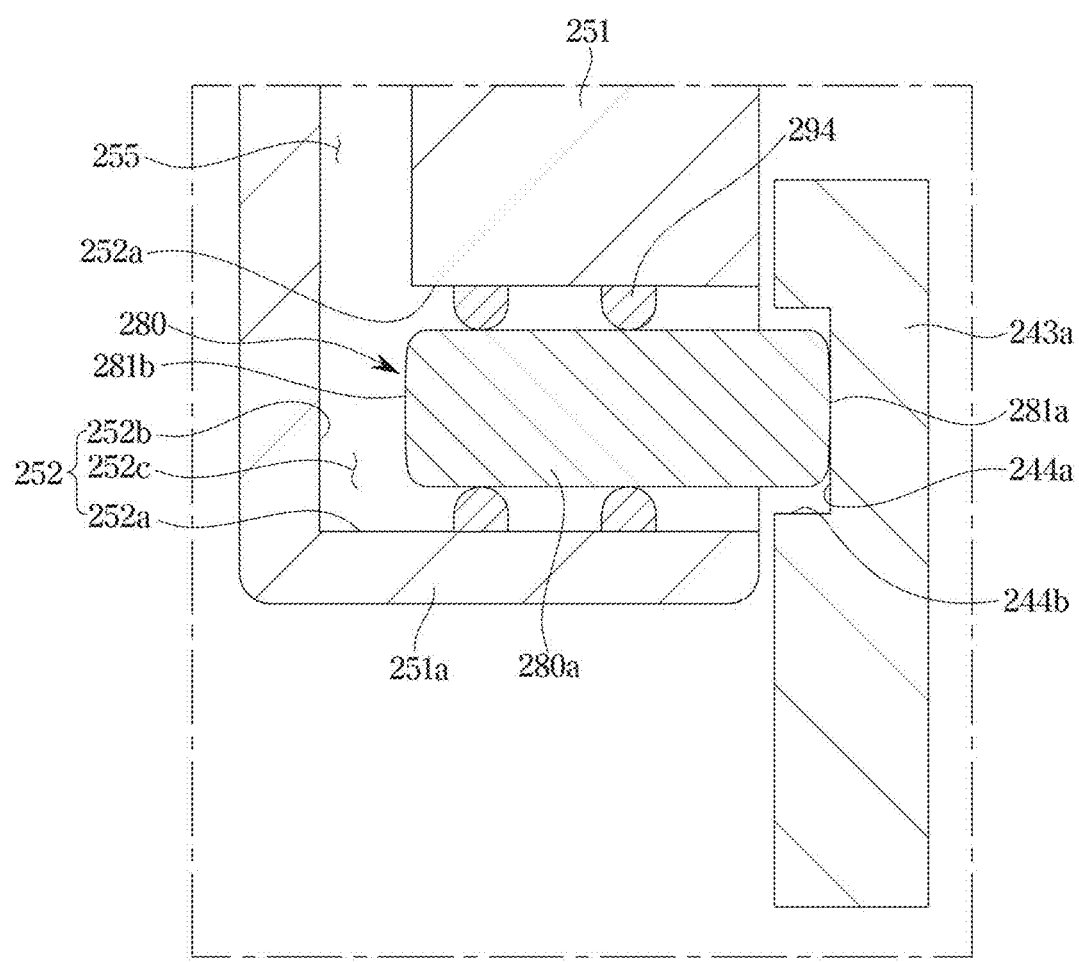
FIG. 28 is a perspective view illustrating a state in which a housing and a fastening pin are coupled to each other in an electronic device according to still another of the various embodiments of the disclosure.

FIG. 28 is a perspective view illustrating a state in which a fastening pin is coupled to a housing in an electronic device according to still another of the various embodiments of the disclosure.

Referring to FIG. 28, according to still another embodiment of the disclosure, a sealing member 294 may be attached to an inner wall 252a of a coupling protrusion 251. The sealing member 294 may be attached to the inner wall 252a of the coupling protrusion 251 to seal a space between a fastening pin 280 and the inner wall 252a. The sealing member 294 may prevent the fastening pin 280 from moving in a state in which the fastening pin 280 is arranged in the coupling hole 252. In addition, the sealing member 294 may seal the space between the fastening pin 280 and the coupling hole 252 to prevent water from flowing into the housing 240. In addition, air may be pressurized in order to couple the fastening pin 280 to the housing 240 and air may be sucked in order to separate the fastening pin 280 form the housing 240. Accordingly, the sealing member 294 may act as a seal so as to allow the housing 240 and the fastening pin 280 to be coupled to each other or to be separated from each other.

Figure 29:
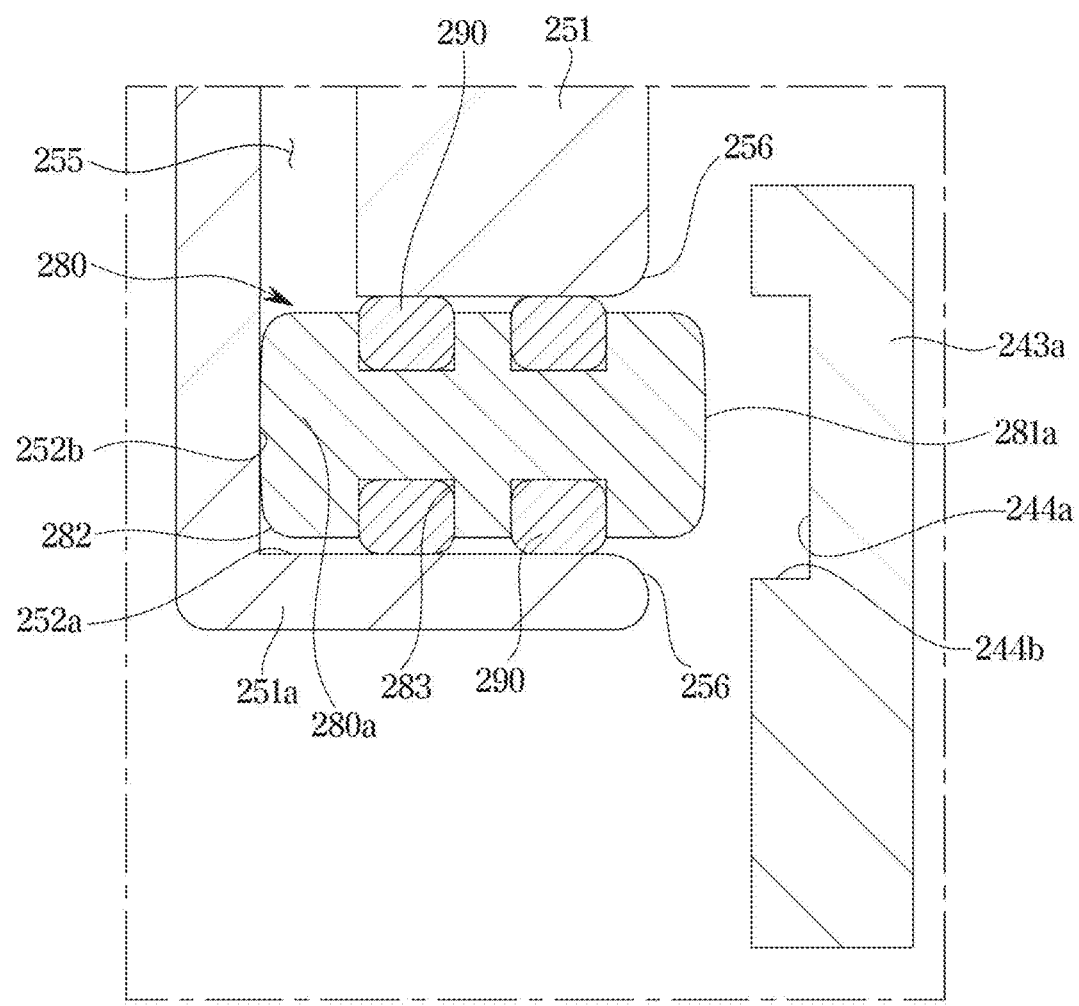
FIG. 29 is a perspective view illustrating a state in which a housing and a fastening pin are separated from each other an electronic device according to still another of the various embodiments of the disclosure.
Figure 30:
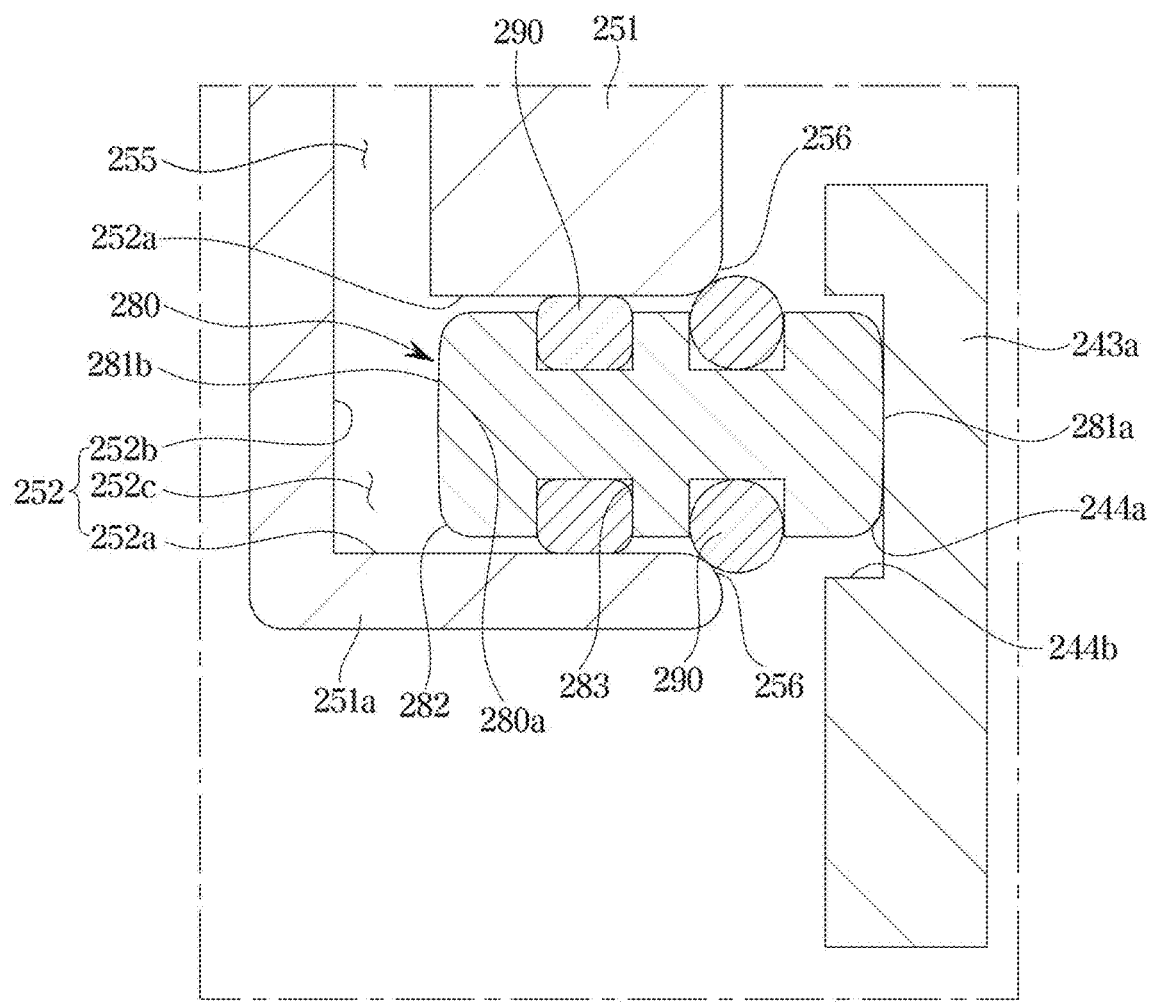
FIG. 30 is a perspective view illustrating a state in which a housing and a fastening pin are coupled to each other in an electronic device according to still another of the various embodiments of the disclosure.

FIG. 29 is a perspective view illustrating a state in which a housing and a fastening pin are separated from each other an electronic device according to still another of the various embodiments of the disclosure. FIG. 30 is a perspective view illustrating a state in which a housing and a fastening pin are coupled to each other in an electronic device according to still another of the various embodiments of the disclosure.

Referring to FIGS. 29 and 30, according to various embodiments of the disclosure, a sealing member 290 may be compressed in response to the fastening pin 280 arranged in the coupling hole 252b. According to various embodiments of the disclosure, the coupling protrusion 251 may include a separation prevention portion 256. The separation prevention portion 256 is recessed in an inner wall 252a forming the coupling hole 252 to prevent the fastening pin 280 from separating from the housing 240 in the state in which the fastening pin 280 is coupled to the housing 240. The separation prevention portion 256 may be formed adjacent to the housing 240 to be in contact with the sealing member 290 in response to fastening pin 280 coupling to the housing 240. For example, the separation prevention portion 256 may be provided on a side adjacent to the first fixing rib 243a. The separation prevention portion 256 may include a round shape. However, the disclosure is not limited thereto, and the separation prevention portion 256 may include various shapes such as a tapered shape. In addition, the separation prevention portion 256 may be provided in plural. One of the plurality of separation prevention portions 256 may include a round shape, and the other of the plurality of separation prevention portion 256 may include a tapered shape.

In the state in which the fastening pin 280 is coupled to the housing 240, the compression of the at least one sealing member 290 may be released. That is, in the state in which the fastening pin 280 is coupled to the housing 240, the at least one sealing member 290 may be returned to its original state. In a state in which the fastening pin 280 and the housing 240 are coupled, the sealing member 290 may be caught by the separation prevention portion 256. The separation prevention portion 256 may prevent the fastening pin 280, to which the sealing member 290 is coupled, from moving toward the coupling hole contact surface 252b side. The separation prevention portion 256 may prevent the coupling pin 280, to which the sealing member 290 is coupled, from separating from the housing 240. Accordingly, the separation prevention portion 256 may increase a coupling force between the fastening pin 280 and the housing 240.

Figure 31:
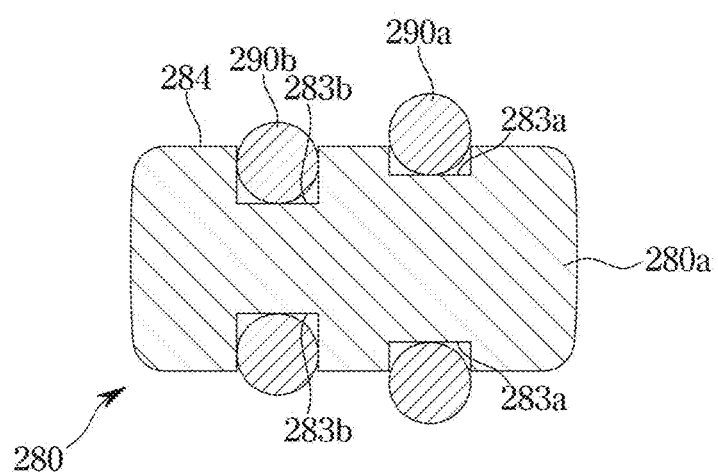
FIG. 31 is a view illustrating a fastening pin and a sealing member in an electronic device according to still another of the various embodiments of the disclosure.

FIG. 31 is a view illustrating a fastening pin and a sealing member in an electronic device according to still another of the various embodiments of the disclosure.

Referring to FIG. 31, according to still another embodiment of the disclosure, a fastening pin 280 may include a sealing groove 283 into which a sealing member 290 is inserted. The sealing groove 283 may include a first sealing groove 283a and a second sealing groove 283b. The first sealing groove 283a and the second sealing groove 283b may be formed to have different depths. For example, the first sealing groove 283a may be formed to have a depth less than that of the second sealing groove 283b. As described above, a sealing member 290 may be compressed upon being arranged in a coupling hole 252b. A sealing member 290a inserted into the first sealing groove 283a may be a first sealing member 290a. A sealing member 290b inserted into the second sealing groove 283b may be the second sealing member 290b. The first sealing member 290a may be compressed more than the second sealing member 290b. In response to the fastening pin 280 coupled to the housing 240, the first sealing member 290a may be more caught by the separation prevention portion 256. It is possible to further prevent the coupling pin 280, to which the sealing member 290 is coupled, from moving toward the coupling hole contact surface 252b side. Accordingly, the coupling force between the fastening pin 280 and the housing 240 may be increased.

Figure 32:
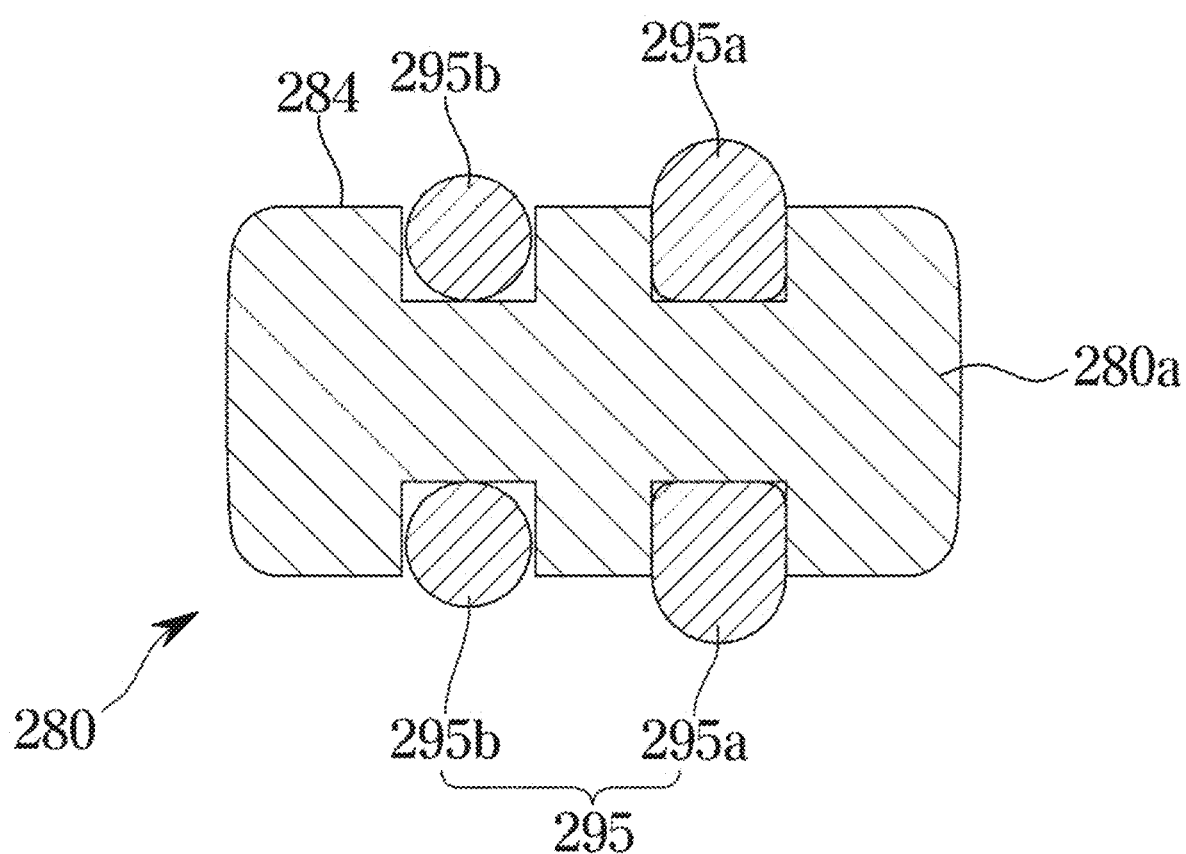
FIG. 32 is a view illustrating a fastening pin and a sealing member in an electronic device according to still another of the various embodiments of the disclosure.

FIG. 32 is a view illustrating a fastening pin and a sealing member in an electronic device according to still another of the various embodiments of the disclosure.

Referring to FIG. 32, according to still another embodiment of the disclosure, an electronic device may include a sealing member 295. The sealing member 295 may include an annular shape. The sealing member 295 may be provided in plural. The sealing members 295 may have different diameters. For example, a first sealing member 295a may have a larger diameter than a second sealing member 295b. Further, the first sealing member 295a may have a larger area than the second sealing member 295b. As described above, the sealing member 290 may be compressed upon being arranged in the coupling hole 252b. Because the diameter of the first sealing member 295a is greater than that of the second sealing member 295b, the first sealing member 295a may be compressed more than the second sealing member 295b. In response to the fastening pin 280 coupled to the housing 240, the first sealing member 295a may be more caught by the separation prevention portion 256. It is possible to further prevent the coupling pin 280, to which the sealing member 295 is coupled, from moving toward the coupling hole contact surface 252b side. Accordingly, the coupling force between the fastening pin 280 and the housing 240 may be increased.

In the drawing, two sealing members 295 are shown, but the disclosure is not limited thereto. Alternatively, a single sealing member 295 may be provided, or three or more sealing members 295 may be provided. For example, the sealing member 295 may be provided with only the first sealing member 295a.

As is apparent from the above description, it is possible to provide an electronic device having improved productivity by reducing the time it takes for a housing and a cover to be coupled.

Further, it is possible to provide an electronic device having an improved external design because a screw is not provided therein.

Although a few embodiments of the disclosure have been shown and described, it would be appreciated by those skilled in the art that changes may be made in these embodiments without departing from the principles and spirit of the disclosure, the scope of which is defined in the claims and their equivalents.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing configured to accommodate a printed circuit hoard; and
   a cover coupled to the housing, and comprising:
      a coupling protrusion protruding to an inner side of the housing to be accommodated in the housing, and a coupling hole formed inside the coupling protrusion;
      a fastening member disposed in the coupling hole and configured to couple the cover to the housing,
      a sealing member disposed between an inner wall forming the coupling hole and the fastening member to seal the coupling hole, and
      an air hole formed in an outer surface of the cover to move the fastening member by injecting or sucking air.

2. The electronic device of claim 1, wherein the sealing member is coupled to an outside of the fastening member.

3. The electronic device of claim 1, wherein the fastening member comprises a sealing groove recessed from an outer surface of the fastening member and configured to receive the sealing member.

4. The electronic device of claim 1, wherein the sealing member is coupled to the inner wall forming the coupling hole to be in close contact with the fastening member.

5. The electronic device of claim 1, wherein the sealing member is insert-injected and coupled to the fastening member.

6. The electronic device of claim 1, wherein:
   the fastening member is movably disposed in the coupling hole, and
   the housing comprises a fixing rib protruding from an inner wall of the housing to face the fastening member with respect to a moving direction of the fastening member, the fixing rib comprising a recess configured to accommodate the fastening member as the fastening member is coupled to the housing.

7. The electronic device of claim 6, wherein:
   according the cover coupling to the housing, a first portion of the fastening member is accommodated in the recess and a second portion of the fastening member is accommodated in the coupling hole, and
   the recess comprises:
      a contact surface in contact with a surface of the fastening member, and
      a plurality of constraining surfaces respectively provided on upper and lower sides of the contact surface and configured to constrain a vertical movement of the fastening member.

8. The electronic device of claim 1, wherein:
   the cover is removably coupled to the housing, and
   according to separating the cover fro the housing, the fastening member is accommodated only in the coupling hole.

9. The electronic device of claim 1, wherein the cover comprises:
   a communication path provided to allow the air hole to communicate with the coupling hole, the communication path connected to the air hole and an end of the coupling hole, respectively.

10. The electronic device of claim 9, wherein, according to injecting air through the air hole and the communication path, the fastening member is moved to couple to the housing.

11. The electronic device of claim 10, wherein:
   the housing comprises a fixing rib protruding from an inner wall of the housing to face the fastening member with respect to a moving direction of the fastening member, and
   the fixing rib comprising a recess configured to accommodate the fastening member to prevent the fastening member from being seen through the air hole according to the fastening member coupling to the housing.

12. The electronic device of claim 9, wherein:
   the cover is removably coupled to the housing,
   according to sucking air through the air hole and the communication path, the fastening member is moved to allow the fastening member to separate from the housing, and
   the fastening member is accommodated only in the coupling hole.

13. The electronic device of claim 2, further comprising:
   a separation prevention portion, according to the fastening member coupled to the housing, provided in contact with the sealing member to prevent the fastening member from separating from the housing.

14. The electronic device of claim 13, wherein the separation prevention portion is disposed adjacent to the housing and comprises at least one of a round shape and a tapered shape.

15. The electronic device of claim 1, wherein:
   the housing comprises a fixing rib protruding from an inner wall of the housing oriented towards the fastening member with respect to a moving direction of the fastening member, and
   the coupling hole extends in a direction perpendicular to a direction in which the coupling protrusion protrudes and a direction in which the fixing rib protrudes, respectively.

* * * * *